US011075199B2

(12) United States Patent
Lee et al.

(10) Patent No.: US 11,075,199 B2
(45) Date of Patent: Jul. 27, 2021

(54) METHOD OF FORMING SEMICONDUCTOR STRUCTURE

(71) Applicant: TAIWAN SEMICONDUCTOR MANUFACTURING CO., LTD., Hsinchu (TW)

(72) Inventors: Yi-Juei Lee, Hsinchu (TW); Chia-Ming Liang, Taipei (TW); Chi-Hsin Chang, New Taipei (TW); Jin-Aun Ng, Hsinchu (TW); Yi-Shien Mor, Hsinchu (TW); Huai-Hsien Chiu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/272,944

(22) Filed: Feb. 11, 2019

(65) Prior Publication Data

US 2019/0189614 A1   Jun. 20, 2019

Related U.S. Application Data

(62) Division of application No. 15/631,000, filed on Jun. 23, 2017, now Pat. No. 10,204,905.

(Continued)

(51) Int. Cl.
| | | |
|---|---|---|
| *H01L 27/088* | (2006.01) | |
| *H01L 27/02* | (2006.01) | |
| *H01L 29/06* | (2006.01) | |
| *H01L 29/08* | (2006.01) | |
| *H01L 21/8234* | (2006.01) | |
| *H01L 21/311* | (2006.01) | |
| *H01L 21/3105* | (2006.01) | |
| *H01L 29/66* | (2006.01) | |

(Continued)

(52) U.S. Cl.
CPC .... *H01L 27/0886* (2013.01); *H01L 21/31055* (2013.01); *H01L 21/31116* (2013.01); *H01L 21/823418* (2013.01); *H01L 21/823431* (2013.01); *H01L 21/823437* (2013.01); *H01L 21/823456* (2013.01); *H01L 21/823481* (2013.01); *H01L 27/0207* (2013.01); *H01L 29/0649* (2013.01); *H01L 29/0847* (2013.01); *H01L 29/165* (2013.01); *H01L 29/42376* (2013.01); *H01L 29/66545* (2013.01); *H01L 29/66636* (2013.01); *H01L 29/7848* (2013.01); *H01L 21/823412* (2013.01)

(58) Field of Classification Search
CPC ..... H01L 21/823418; H01L 21/823431; H01L 21/823437; H01L 21/823456; H01L 21/823481; H01L 21/823412
USPC ........................................................ 257/401
See application file for complete search history.

(56) References Cited

U.S. PATENT DOCUMENTS 9,324,713 B1    4/2016   Yu et al.
9,331,074 B1 *  5/2016   Chang ................ H01L 27/0886
(Continued)

*Primary Examiner* — Walter H Swanson
(74) *Attorney, Agent, or Firm* — Maschoff Brennan

(57) ABSTRACT

A method includes forming a first fin on a semiconductor substrate, forming an isolation dielectric material over the first fin, and planarizing the isolation dielectric material. A top surface of the first fin is covered by the isolation dielectric material after planarizing the isolation dielectric material. The method further includes etching back the isolation dielectric material until the first fin protrudes from the isolation dielectric material.

20 Claims, 21 Drawing Sheets

Related U.S. Application Data

(60) Provisional application No. 62/490,020, filed on Apr. 25, 2017.

(51) Int. Cl.
  *H01L 29/78* (2006.01)
  *H01L 29/165* (2006.01)
  *H01L 29/423* (2006.01)

(56) References Cited

U.S. PATENT DOCUMENTS

| | | |
|---|---|---|
| 9,418,994 B1 | 8/2016 | Chao et al. |
| 2011/0121406 A1 | 5/2011 | Lee et al. |
| 2015/0069535 A1 | 3/2015 | Chang et al. |
| 2015/0287795 A1 | 10/2015 | Gaan et al. |
| 2017/0005005 A1 | 1/2017 | Chen et al. |
| 2017/0317079 A1 | 11/2017 | Kim et al. |
| 2017/0365522 A1 | 12/2017 | Jeong et al. |

\* cited by examiner

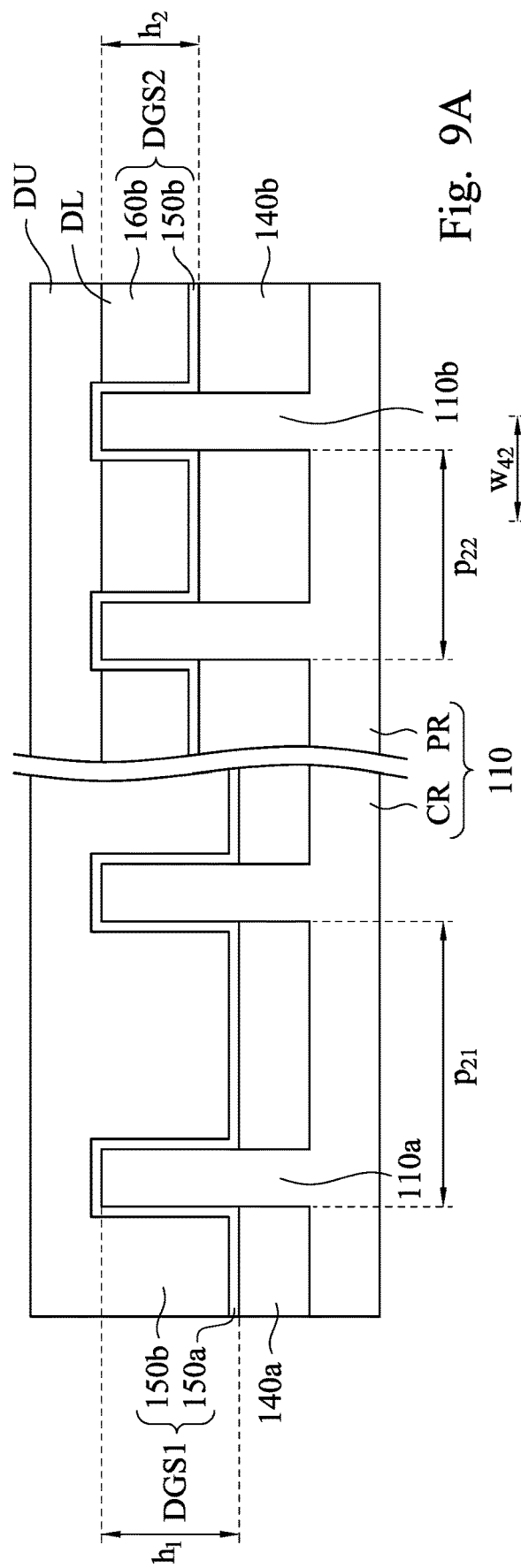
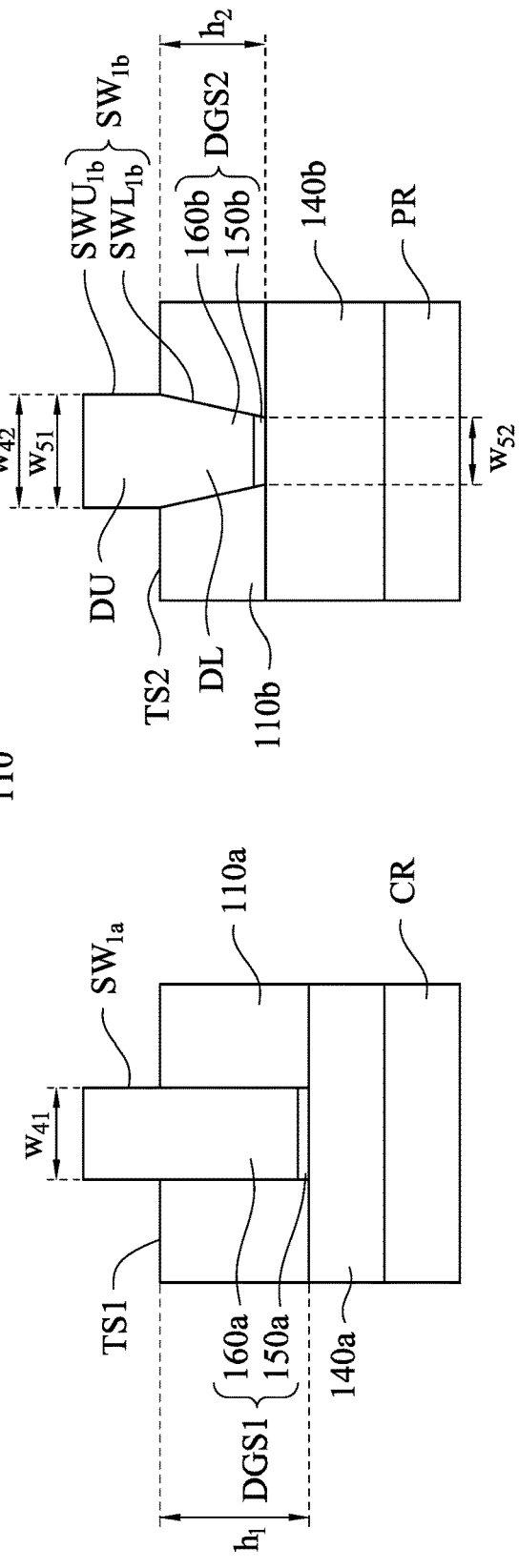
Fig. 9A
Fig. 9B
Fig. 9C

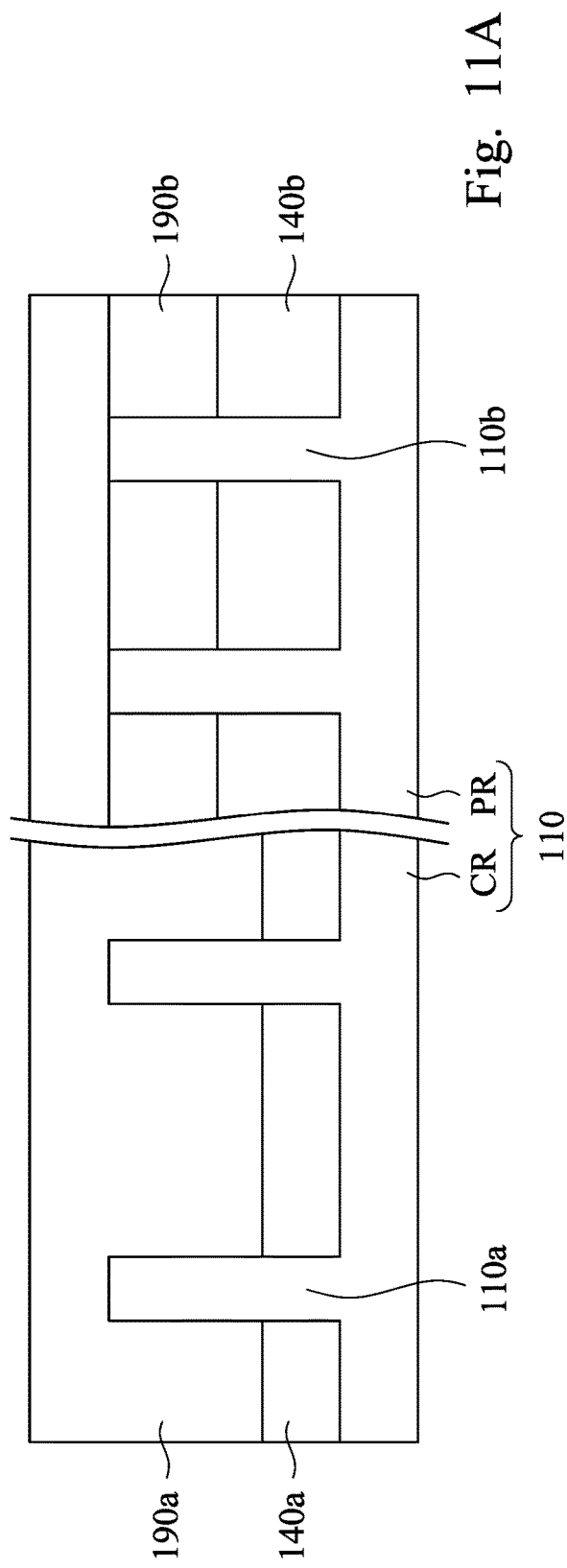
Fig. 11A
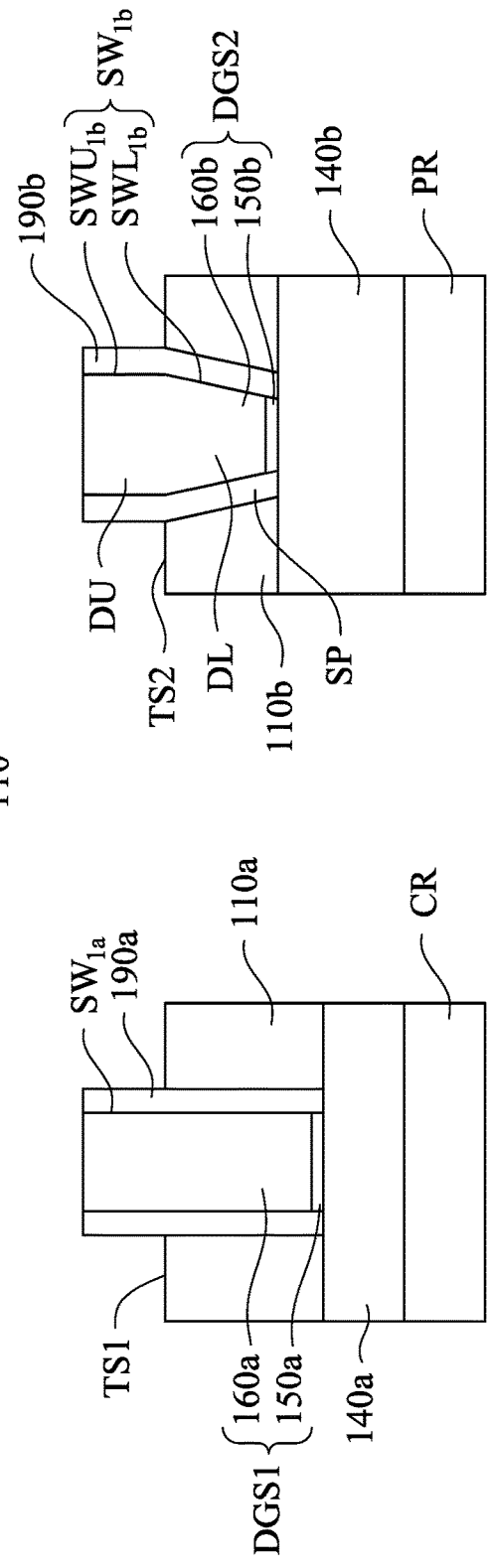
Fig. 11B
Fig. 11C

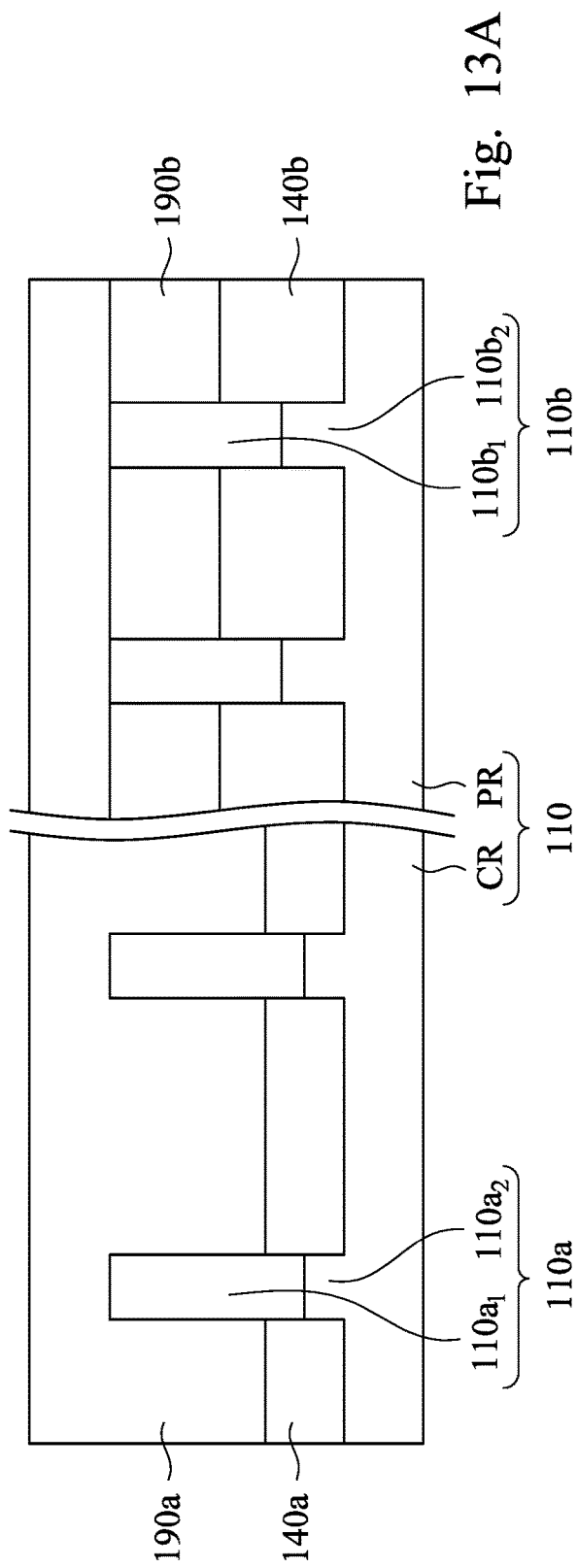
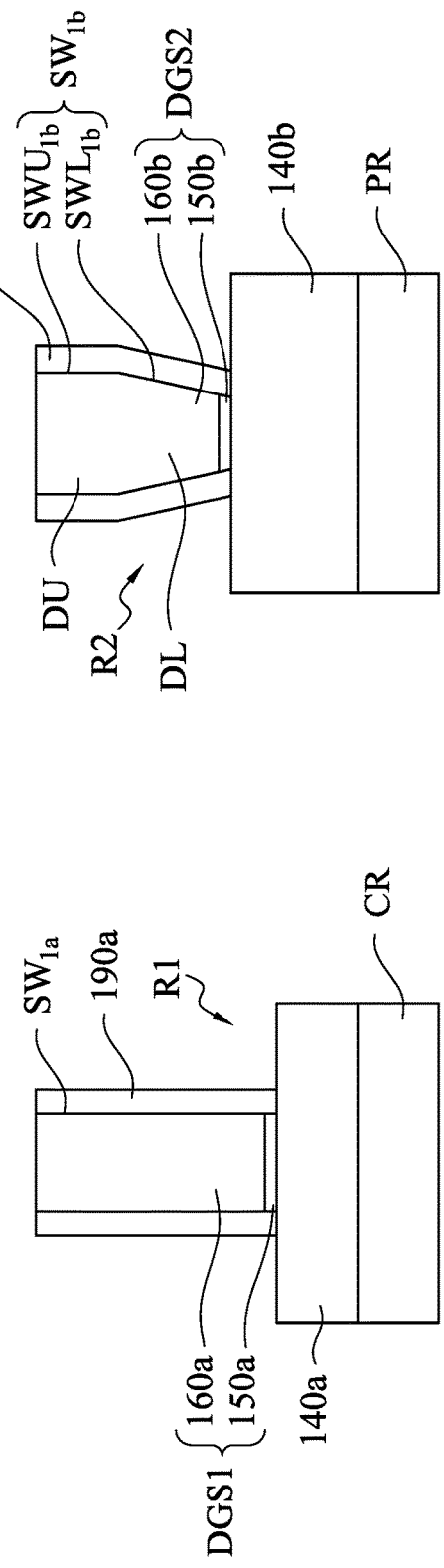
Fig. 13A
Fig. 13B
Fig. 13C

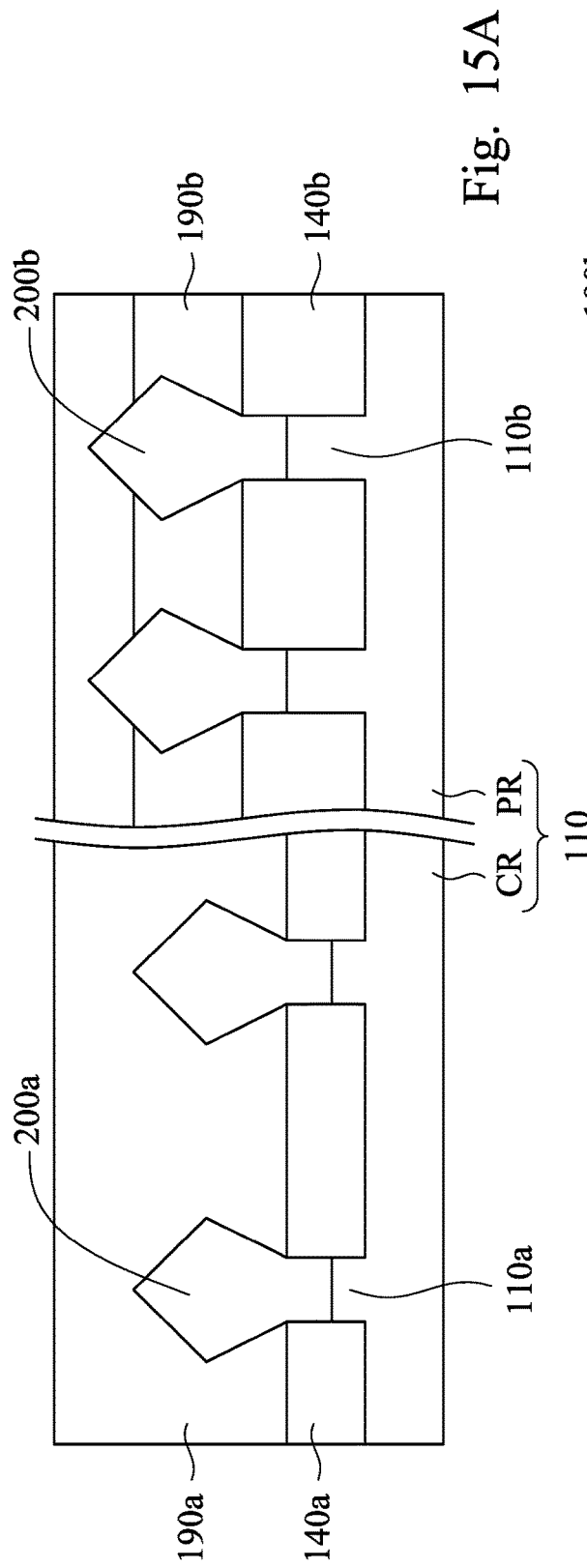
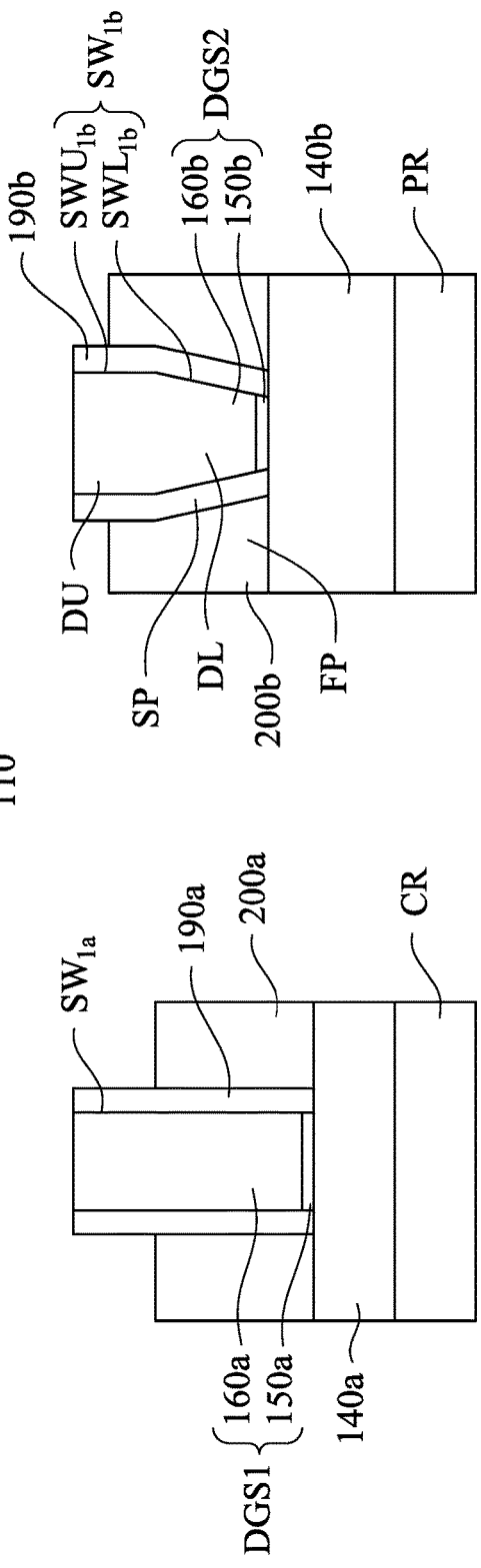
Fig. 15A
Fig. 15B
Fig. 15C

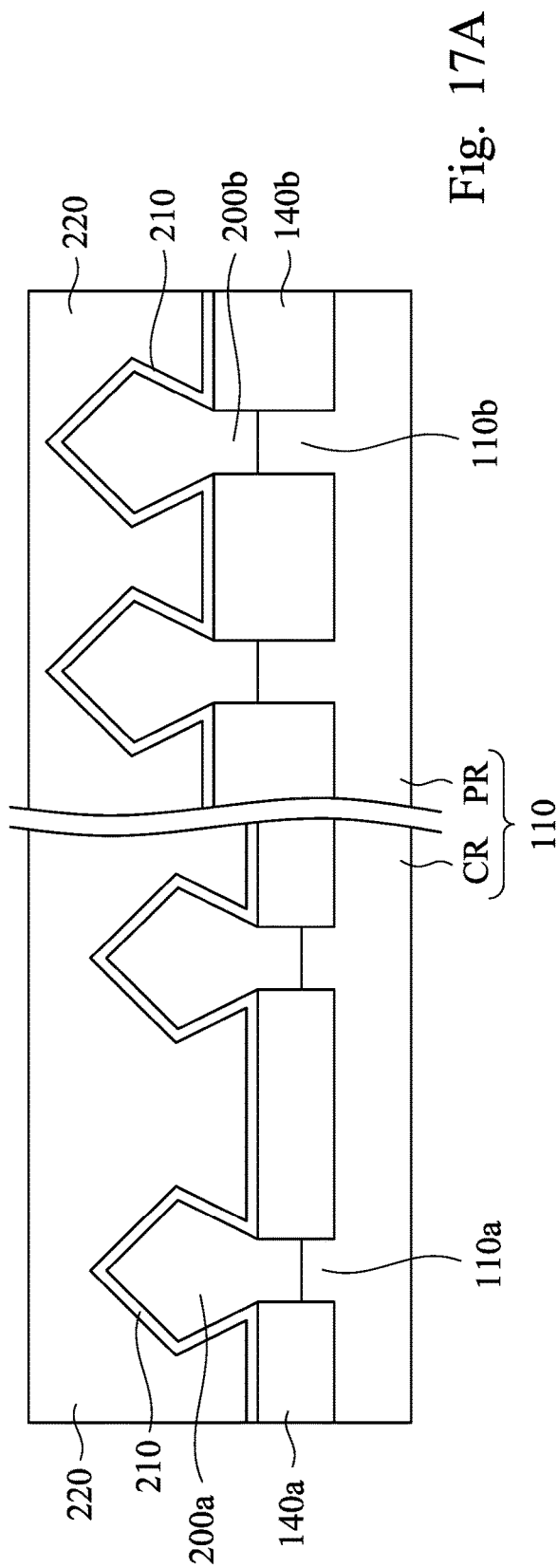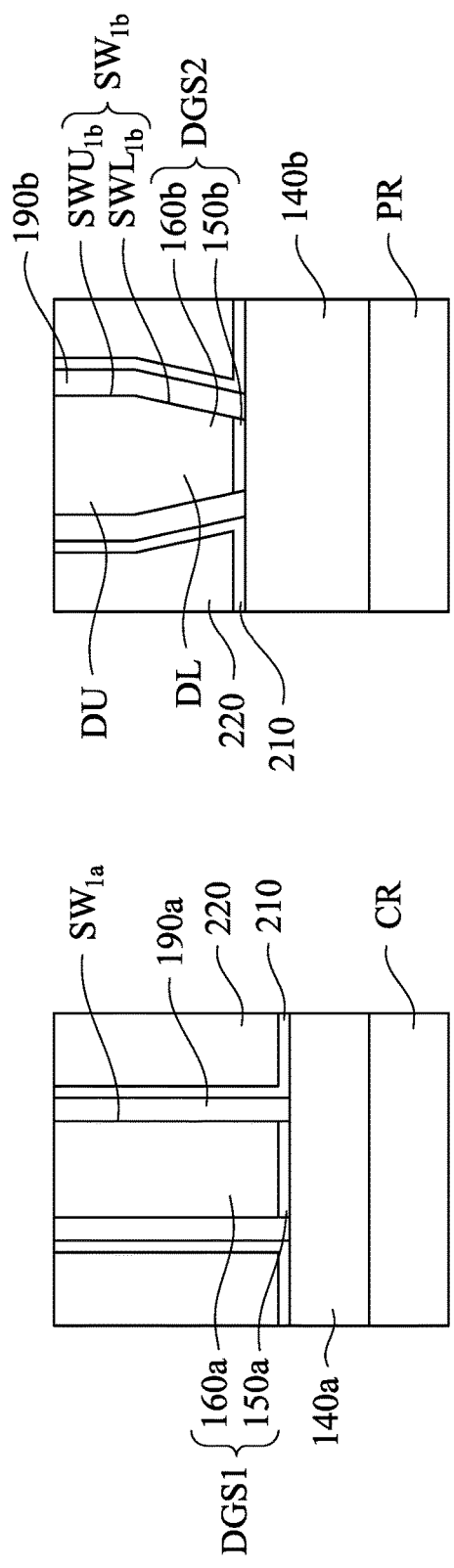
Fig. 17A
Fig. 17B
Fig. 17C

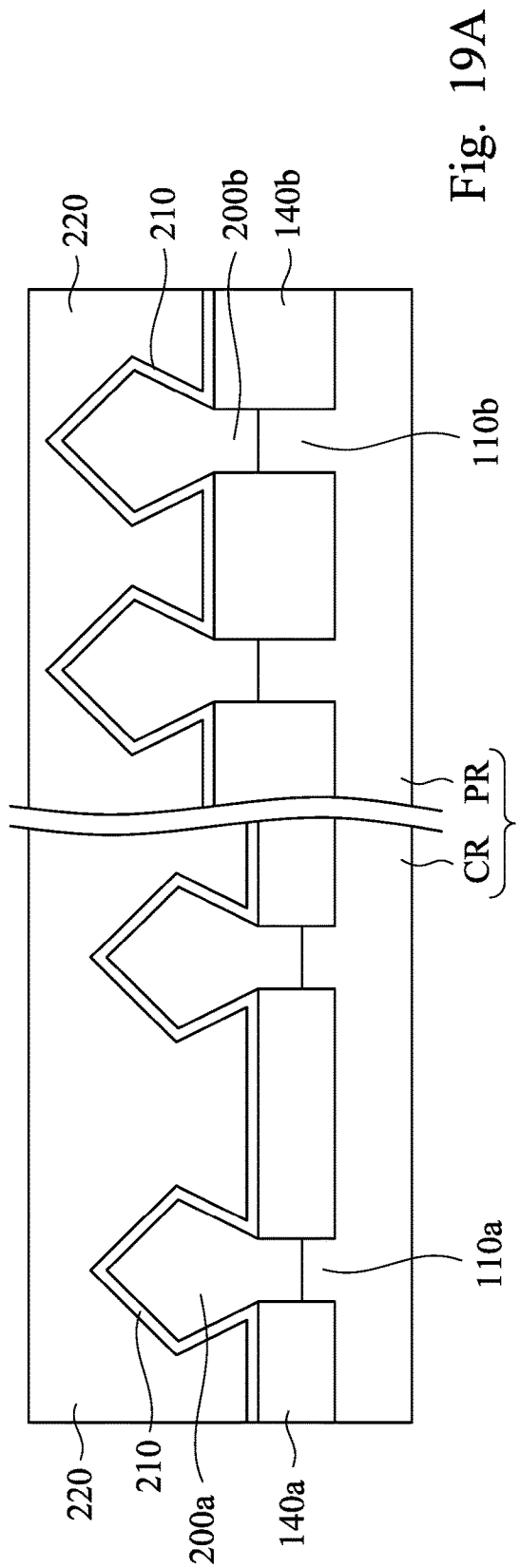
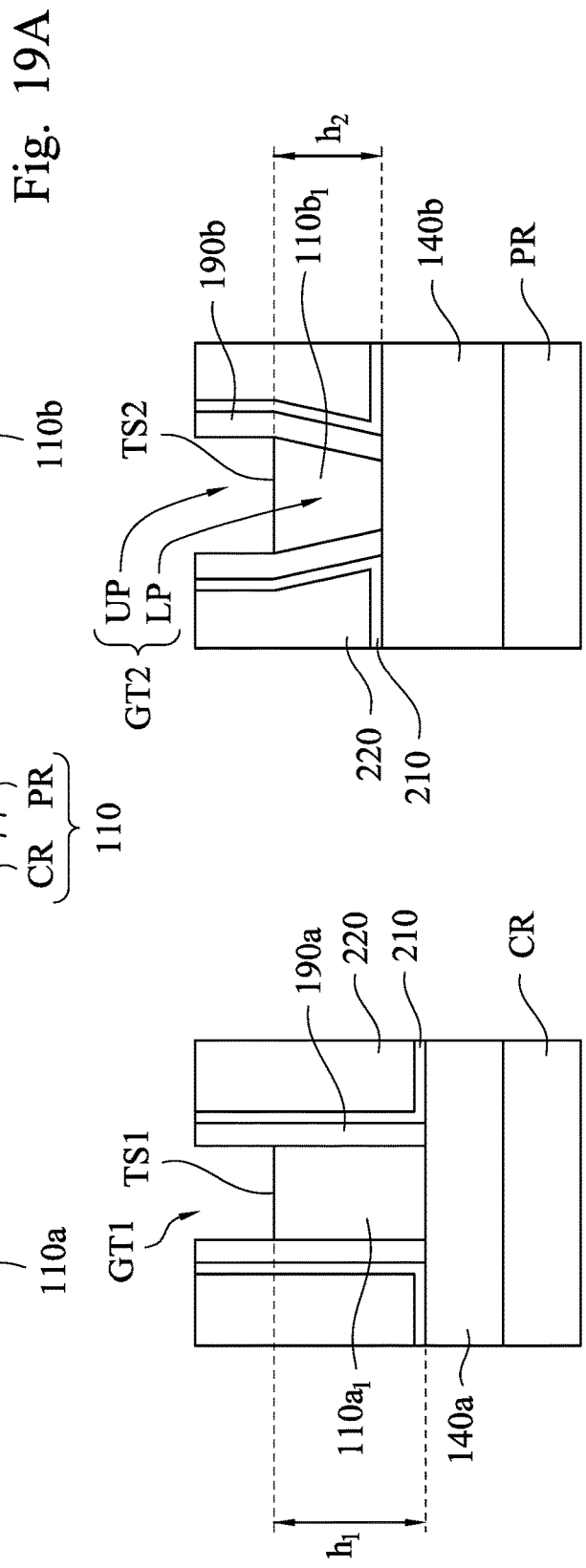
Fig. 19A
Fig. 19B
Fig. 19C

US 11,075,199 B2

METHOD OF FORMING SEMICONDUCTOR STRUCTURE

PRIORITY CLAIM AND CROSS-REFERENCE

The present application is a divisional application of U.S. application Ser. No. 15/631,000, filed Jun. 23, 2017, now U.S. Pat. No. 10,204,905, issued Feb. 12, 2019, which claims priority of U.S. Provisional Application Ser. No. 62/490,020, filed Apr. 25, 2017, all of which are herein incorporated by reference in their entireties.

BACKGROUND

The semiconductor integrated circuit (IC) industry has experienced rapid growth and has strived for higher device density, higher performance, and lower costs. However, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to Fin-FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A, 11A, 13A, 15A, 17A, 19A, and 21A are cross-sectional views along lines A-A' in FIGS. 8, 10, 12, 14, 16, 18, and 20 respectively.

FIGS. 9B, 11B, 13B, 15B, 17B, 19B, and 21B are cross-sectional views along lines B-B' in FIGS. 8, 10, 12, 14, 16, 18, and 20 respectively.

FIGS. 9C, 11C, 13C, 15C, 17C, 19C, and 21C are cross-sectional views along lines C-C' in FIGS. 8, 10, 12, 14, 16, 18, and 20 respectively.

DETAILED DESCRIPTION

Figure 1:
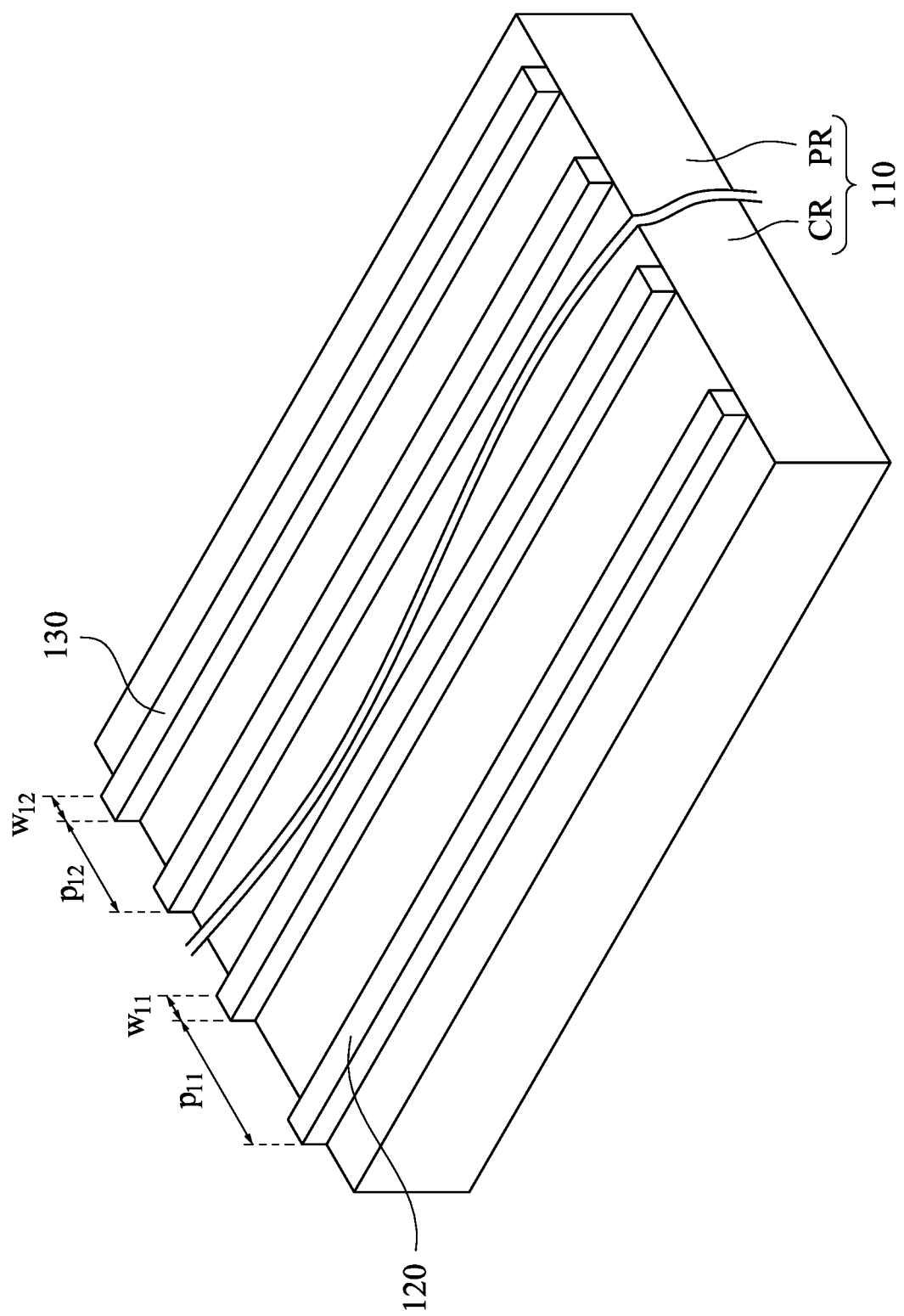
FIGS. 1-8, 10, 12, 14, 16, 18, and 20 illustrate a method for manufacturing a semiconductor structure at various stages in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-8, 10, 12, 14, 16, 18, and 20 illustrate a method for manufacturing a semiconductor structure at various stages in accordance with some embodiments of the instant disclosure.

Figure 2:
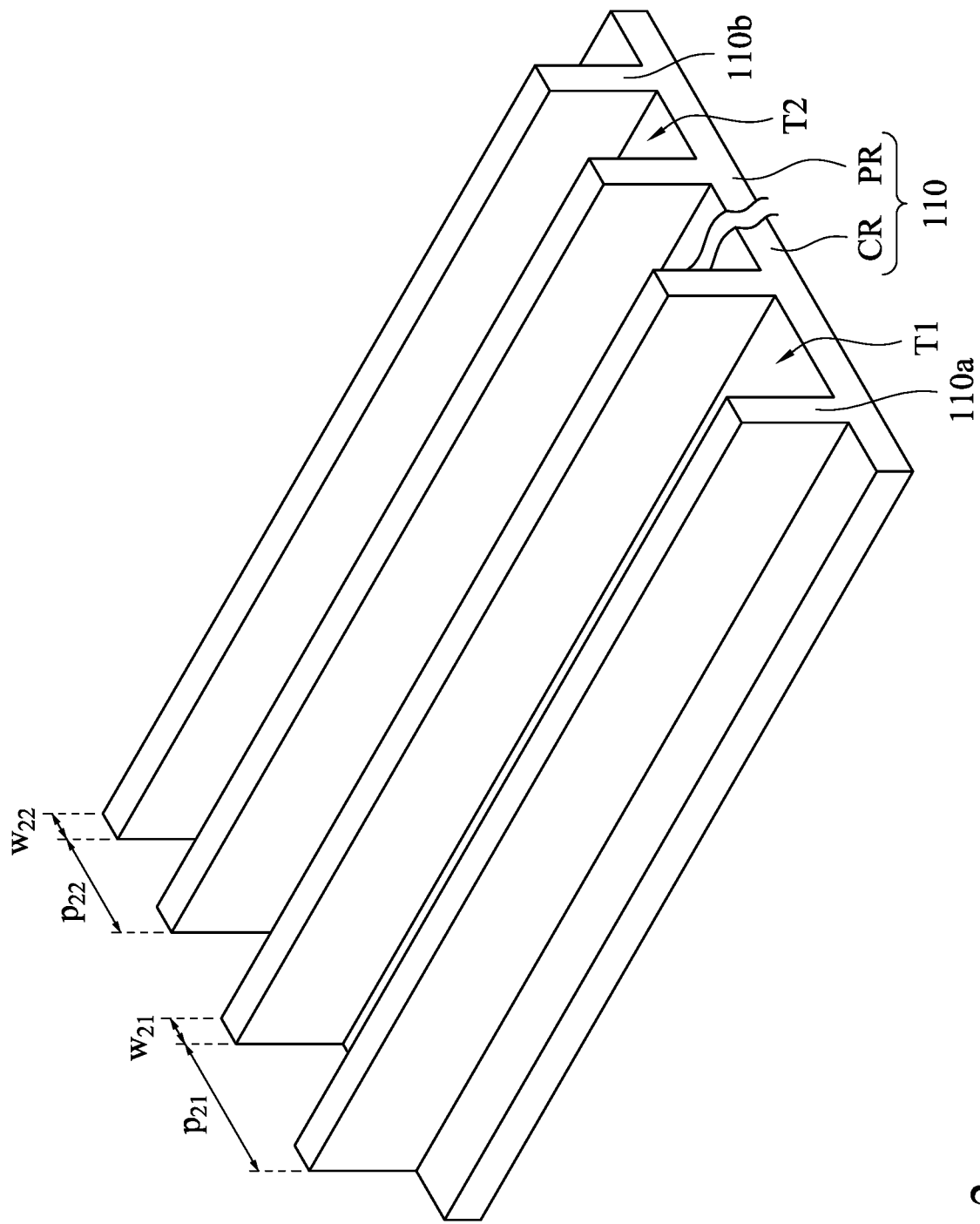

Reference is made to FIGS. 1-2. A substrate 110 having a plurality of first fins 110a and a plurality of second fins 110b is formed. The substrate 110 shown in FIG. 1 is illustrated. The substrate 110 has a core region CR and a periphery region PR adjacent to the core region CR. For example, the periphery region PR surrounds the core region CR. The periphery region PR can be referred as an input/output (I/O) region. In some embodiments, the substrate 110 may be a semiconductor substrate, such as a bulk semiconductor, a semiconductor-on-insulator (SOI) substrate, or the like. The substrate 110 may be a wafer, such as a silicon wafer. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon substrate or a glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Please still referring to FIG. 1, a plurality of first photo-sensitive layers 120 are formed on the core region CR of the substrate 110, and a plurality of second photo-sensitive layers 130 are formed on the periphery region PR of the substrate 110. Although two first photo-sensitive layers 120 and two second photo-sensitive layers 130 are shown in FIG. 1, it should be clear that there are number of such "photo-sensitive layers" that are separated from one another. Moreover, it is noted that a first pitch $p_{11}$ between two adjacent first photo-sensitive layers 120 is greater than a second pitch $p_{12}$ between two adjacent second photo-sensitive layers 130. In some embodiments, a width $w_{11}$ of the first photo-sensitive layer 120 is substantially equal to a width $w_{12}$ of the second photo-sensitive layer 130. However, it is noted that the scope of this application is not limited thereto. The term "substantially" as used herein may be applied to modify any quantitative representation which could permissibly vary without resulting in a change in the basic function to which it is related.

In some embodiments, the photo-sensitive layers 120 and the second photo-sensitive layers 130 are formed by the following operations. A photo-sensitive layer is formed on the core region CR and the periphery region PR of the substrate 110. The photo-sensitive layer is patterned, forming openings in the photo-sensitive layer, so that some regions of the substrate 110 are exposed, and thus the first photo-sensitive layers 120 and the second photo-sensitive layers 130 are formed.

Please referring to FIG. 2, the substrate 110 is etched through the first photo-sensitive layers 120 and the second photo-sensitive layers 130 to form the first fins 110a, the second fins 110b, first trenches T1 adjacent to the first fins 110a, and second trenches T2 adjacent to the second fins 110b. More specifically, a portion of the substrate 110 between neighboring first trenches T1 forms the first fin 110a, and a portion of the substrate 110 between neighboring second trenches T2 forms the second fin 110b. The first trenches T1 and the second trenches T2 may be trench strips (when viewed in the top view of the semiconductor structure) that are substantially parallel to each other. In some embodiments, a height of the first fin 110a is substantially the same as a height of the second fin 110b. Although two first fins 110a and two second fins 110b are shown, it should be clear that there are number of such "fins" that are separated from one another. In some other embodiments, the numbers of the first fins 110a and the second fins 110b can be different. For example, the number of the second fins 110b is greater than the number of the first fins 110a. The number of the first fins 110a can be less than or equal to 4, and the number of the second fins 110b can be greater than or equal to 12.

Because the substrate 110 is patterned by the first photo-sensitive layers 120 and the second photo-sensitive layers 130, a first pitch $p_{21}$ between two adjacent first fins 110a is greater than a second pitch $p_{22}$ between two adjacent second fins 110b. In some embodiments, a fin width $w_{21}$ of the first fin 110a is substantially equal to a fin width $w_{22}$ of the second fin 110b. However, it is noted that the scope of this application is not limited thereto. In some other embodiments, the fin width $w_{21}$ of the first fin 110a is substantially greater than the fin width $w_{22}$ of the second fin 110b. In still some embodiments, the fin width $w_{21}$ of the first fin 110a is substantially less than the fin width $w_{22}$ of the second fin 110b. After forming the first fins 110a and the second fins 110b, the first photo-sensitive layers 120 and the second photo-sensitive layers 130 are removed.

Figure 3:
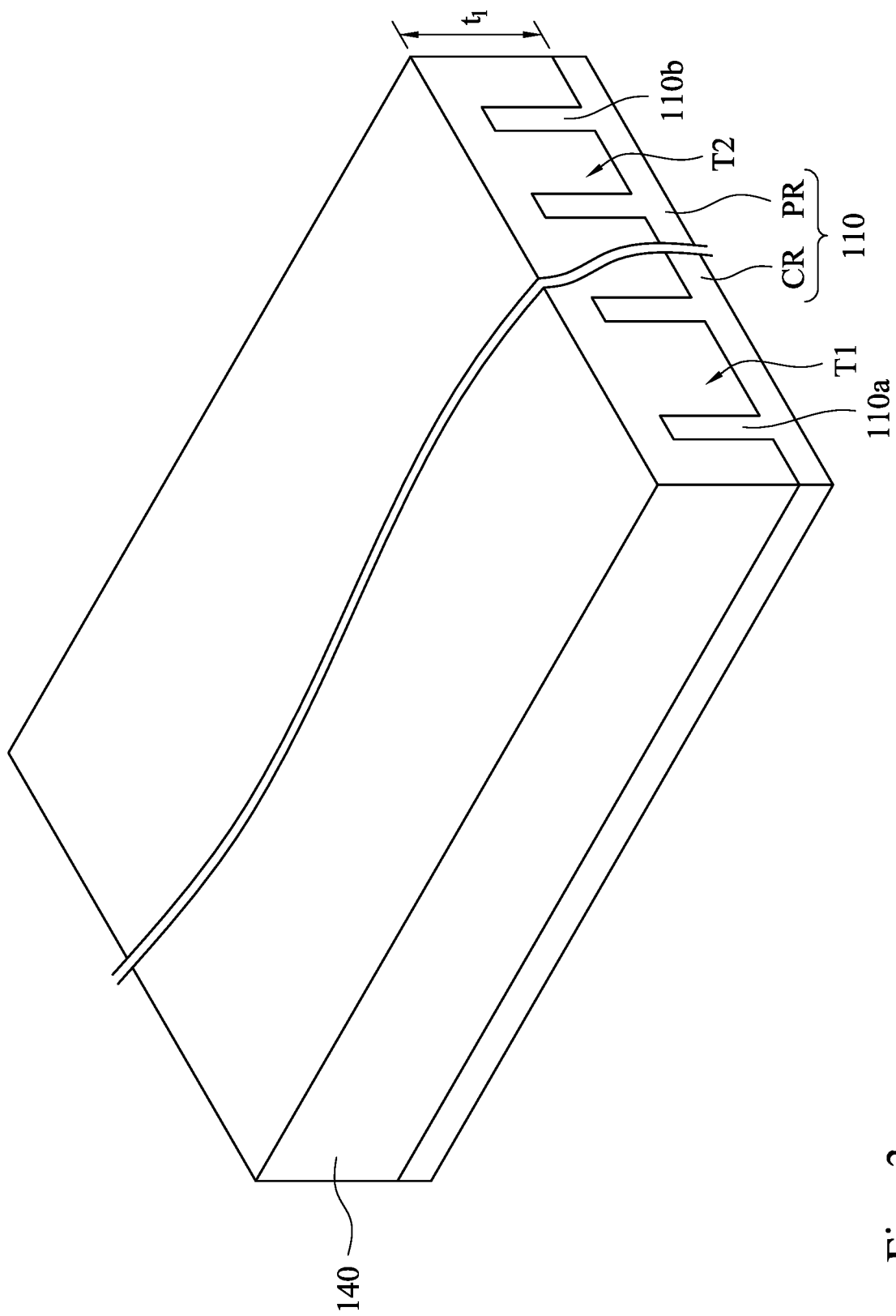

Attention is now invited to FIG. 3. An isolation dielectric 140 is formed to cover the first fins 110a and the second fins 110b. The isolation dielectric 140 has a thickness $t_1$. The isolation dielectric 140 may overfill the first trenches T1 and the second trenches T2. The isolation dielectric 140 in the first trenches T1 and the second trenches T2 can be referred to as shallow trench isolation (STI) structure. In some embodiments, the isolation dielectric 140 is made of silicon oxide, silicon nitride, silicon oxynitride, fluoride-doped silicate glass (FSG), or other low-K dielectric materials. In some embodiments, the isolation dielectric 140 may be formed using a high-density-plasma (HDP) chemical vapor deposition (CVD) process, using silane ($SiH_4$) and oxygen ($O_2$) as reacting precursors. In some other embodiments, the isolation dielectric 140 may be formed using a sub-atmospheric CVD (SACVD) process or high aspect-ratio process (HARP), wherein process gases may include tetraethylorthosilicate (TEOS) and ozone ($O_3$). In yet other embodiments, the isolation dielectric 140 may be formed using a spin-on-dielectric (SOD) process, such as hydrogen silsesquioxane (HSQ) or methyl silsesquioxane (MSQ). Other processes and materials may be used. In some embodiments, the isolation dielectric 140 can have a multi-layer structure, for example, a thermal oxide liner layer with silicon nitride formed over the liner. Thereafter, a thermal annealing may be optionally performed to the isolation dielectric 140.

Figure 4:
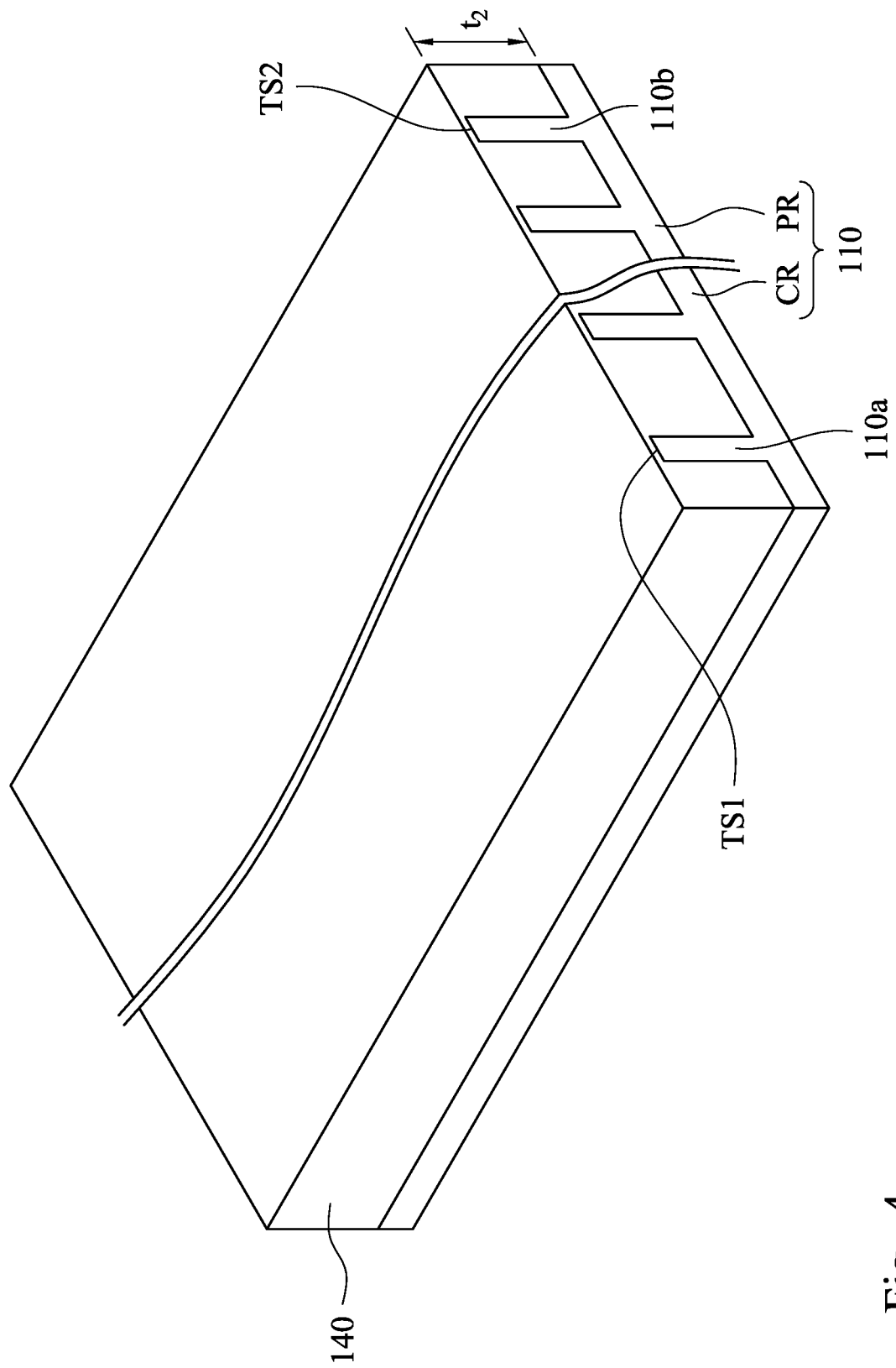

Reference is made to FIG. 4. The thickness $t_1$ of the isolation dielectric 140 is reduced to leave the isolation dielectric 140 covering top surfaces TS1 of the first fins 110a and top surfaces TS2 of the second fins 110b. In other words, reducing the thickness $t_1$ of the isolation dielectric 140 stops before the top surfaces TS1 of the first fins 110a and the top surfaces TS2 of the second fins 110b expose. In other words, a portion of the isolation dielectric 140 outside the first trenches T1 and the second trenches T2 is removed without exposing the first fins 110a and the second fins 110b. The thickness $t_1$ of the isolation dielectric 140 shown in FIG. 3 is reduced to a thickness $t_2$ of the isolation dielectric 140 shown in FIG. 4. In some embodiments, reducing the thickness $t_1$ of the isolation dielectric 140 is performed by chemical-mechanical planarization (CMP).

Figure 5:
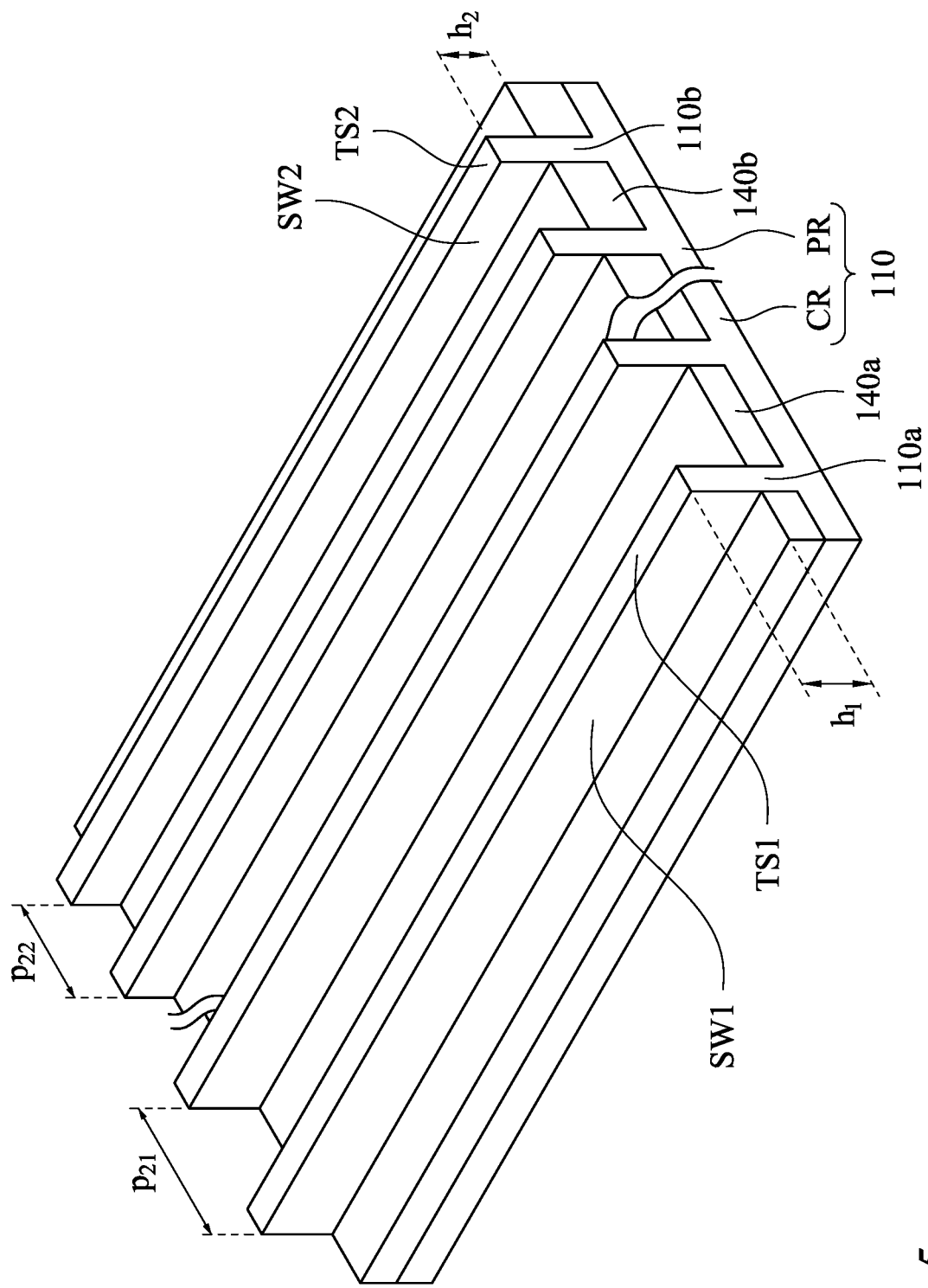

Please refer to FIG. 5. The isolation dielectric 140 covering the top surfaces TS1 of the first fins 110a and the top surfaces TS2 of the second fins 110b is etched to form a first isolation dielectric 140a between the first fins 110a and a second isolation dielectric 140b between the second fins 110b. More specifically, etching the isolation dielectric 140 covering the top surfaces TS1 of the first fins 110a and the top surfaces TS2 of the second fins 110b stops until the top surfaces TS1 and sidewalls SW1 of the first fins 110a and the top surfaces TS2 and sidewalls SW2 the second fins 110b are exposed. In other words, etching the isolation dielectric 140 covering the top surfaces TS1 of the first fins 110a and the top surfaces TS2 of the second fins 110b includes removing the isolation dielectric 140 above the top surfaces TS1 of the first fins 110a and the top surfaces TS2 of the second fins 110b, a portion of the isolation dielectric 140 between the first fins 110a, and a portion of the isolation dielectric 140 between the second fins 110b. After etching the isolation dielectric 140, a portion of the first fin 110a is higher than a top of the first isolation dielectric 140a, and a portion of the second fin 110b is higher than a top of the second isolation dielectric 140b. Hence, this portion of the first fin 110a protrudes above the first isolation dielectric 140a, and this portion of the second fin 110b protrudes above the second isolation dielectric 140b. In some embodiments, etching the isolation dielectric 140 is performed by dry etching, wherein diluted HF, SiCoNi (including HF and $NH_3$), or the like, may be used as the etchant.

As shown in FIG. 5, it is noted that the first isolation dielectric 140a between the first fins 110a is thinner than the second isolation dielectric 140b between the second fins 110b. Accordingly, the top of the first isolation dielectric 140a is below the top of the second isolation dielectric 140b. Moreover, a first height $h_1$ from the top of at least one of the first fins 110a to the top of the first isolation dielectric 140a is greater than a second height $h_2$ from at least one of the top of the second fins 110b to the top of the second isolation dielectric 140b. In some embodiments, a height difference between the first height $h_1$ and the second height $h_2$ ($h_1$-$h_2$) is greater than about 3 nm. In some embodiments, the first fins 110a substantially level with the second fins 110b.

Figure 6:
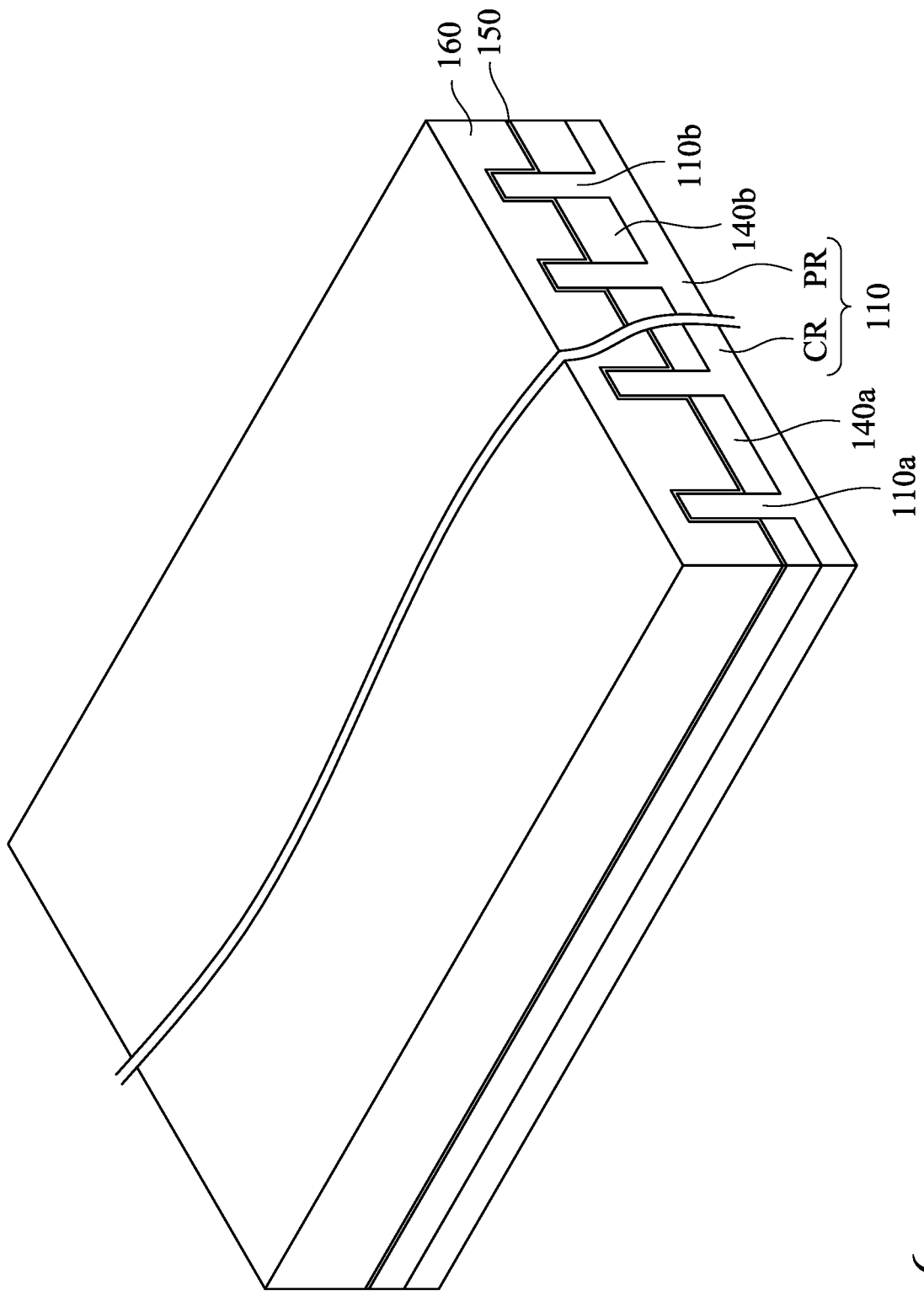

Reference is made to FIG. 6. A gate dielectric layer 150 is blanket formed over the first fins 110a, the second fins 110b, the first isolation dielectric 140a, and the second isolation dielectric 140b. After the gate dielectric layer 150 is formed, a dummy gate electrode layer 160 is formed over the gate dielectric layer 150. In some embodiments, the gate dielectric layer 150 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 150 is an oxide layer. The gate dielectric layer 150 may be formed by a deposition processes, such as chemical vapor deposition (CVD), physical vapor deposition (PVD), atomic layer deposition (ALD), plasma enhanced CVD (PECVD) or other suitable techniques. In some embodiments, the dummy gate electrode layer 160 may include polycrystalline-silicon (poly-Si), polycrystalline silicon-germanium (poly-SiGe), metallic nitrides, metallic silicides, metallic oxides, or metals. In some embodiments, the dummy gate electrode layer 160 includes a metal-containing material such as TiN, TaN, TaC, Co, Ru, Al, combinations thereof, or multi-layers thereof. The dummy gate electrode layer 160 may be deposited by CVD, physical vapor deposition (PVD), sputter deposition, or other techniques suitable for depositing conductive materials.

For clarity, in the following FIGS. 7-17C, the gate dielectric layer 150 over the core region CR is referred to as a gate dielectric layer 150a. The dummy gate electrode layer 160 over the core region CR is referred to as a dummy gate electrode layer 160a. The gate dielectric layer 150 over the periphery region PR is referred to as a gate dielectric layer 150b. The dummy gate electrode layer 160 over the periphery region PR is referred to as a dummy gate electrode layer 160b.

Figure 7:
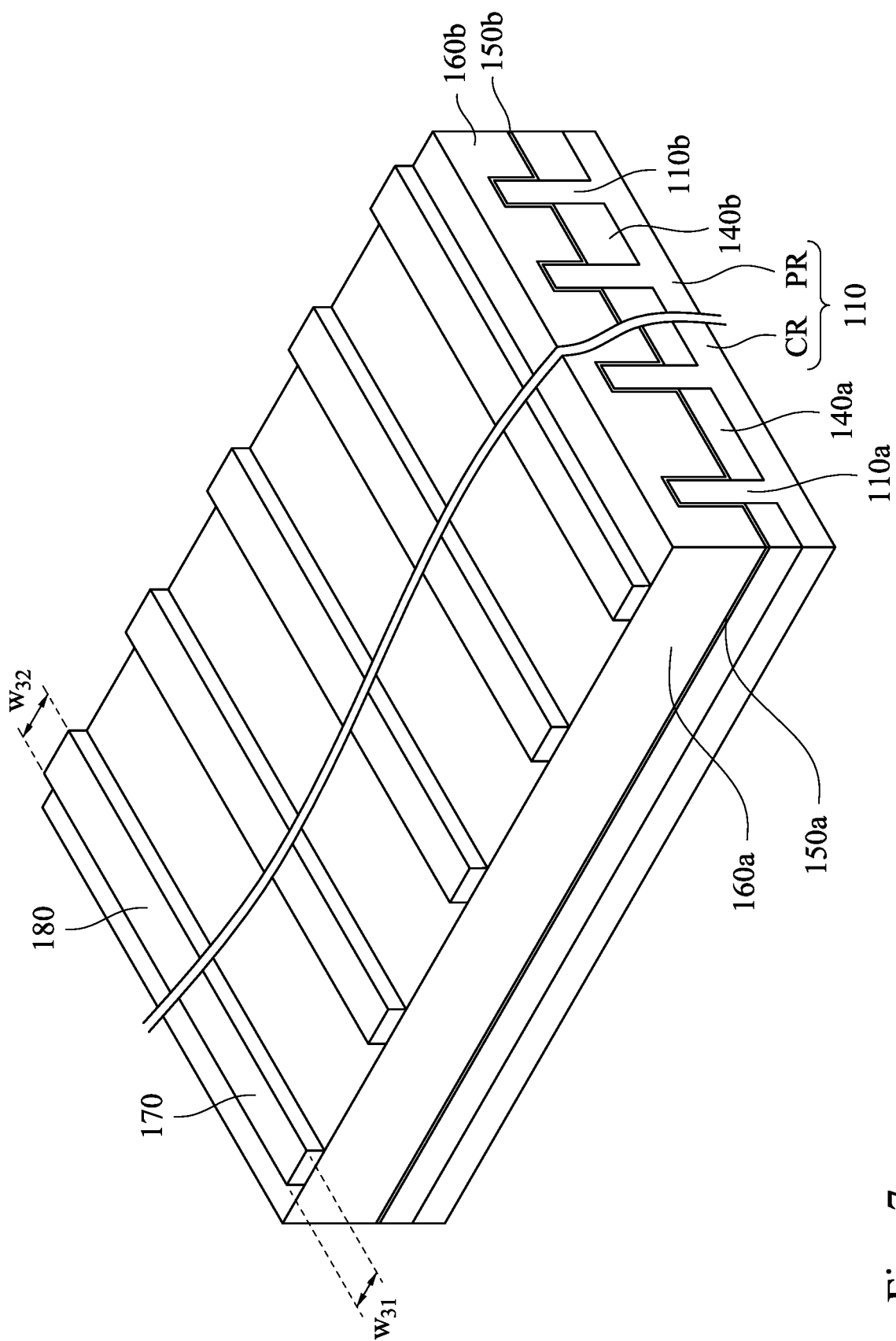
Figure 8:
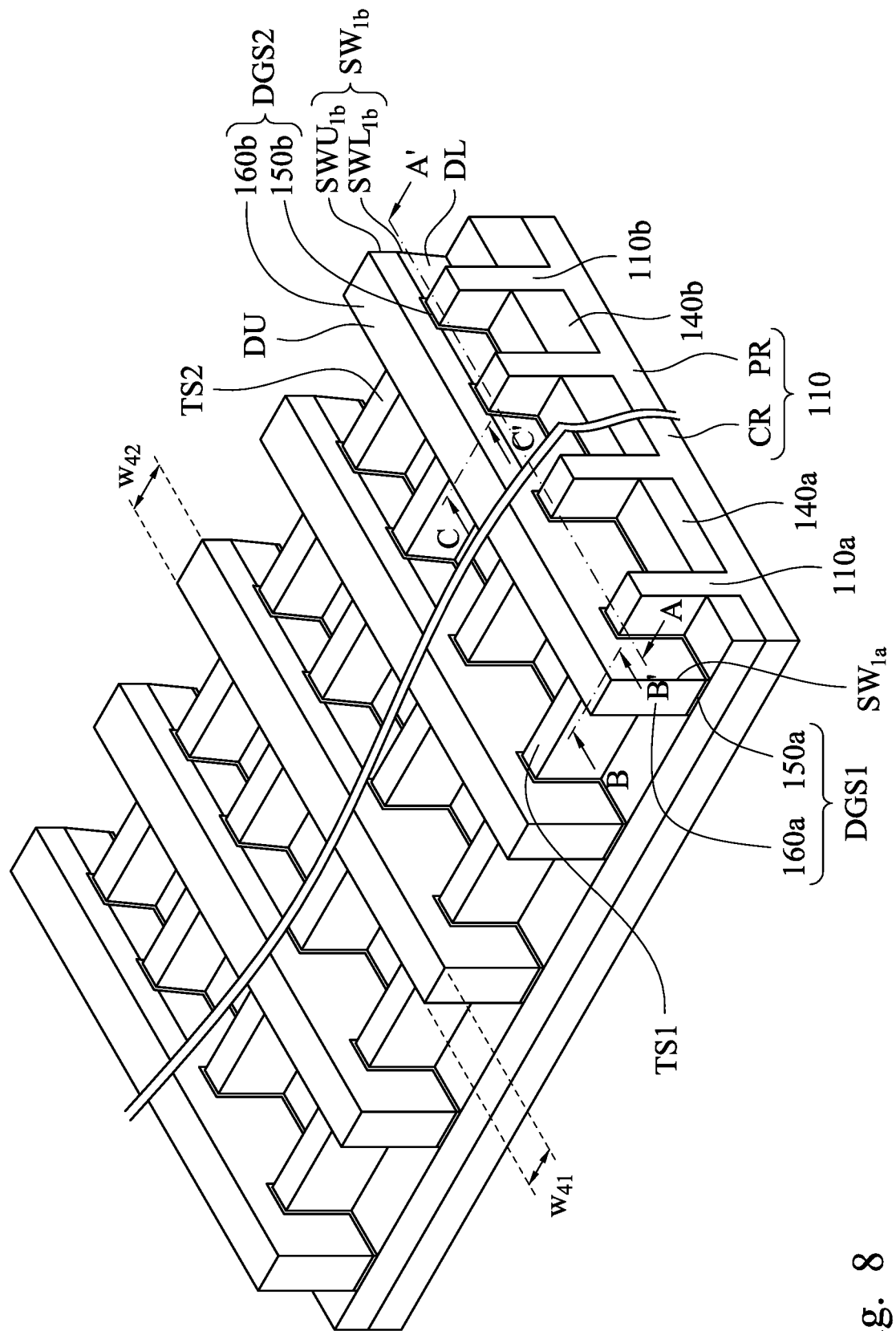
Figure 10:
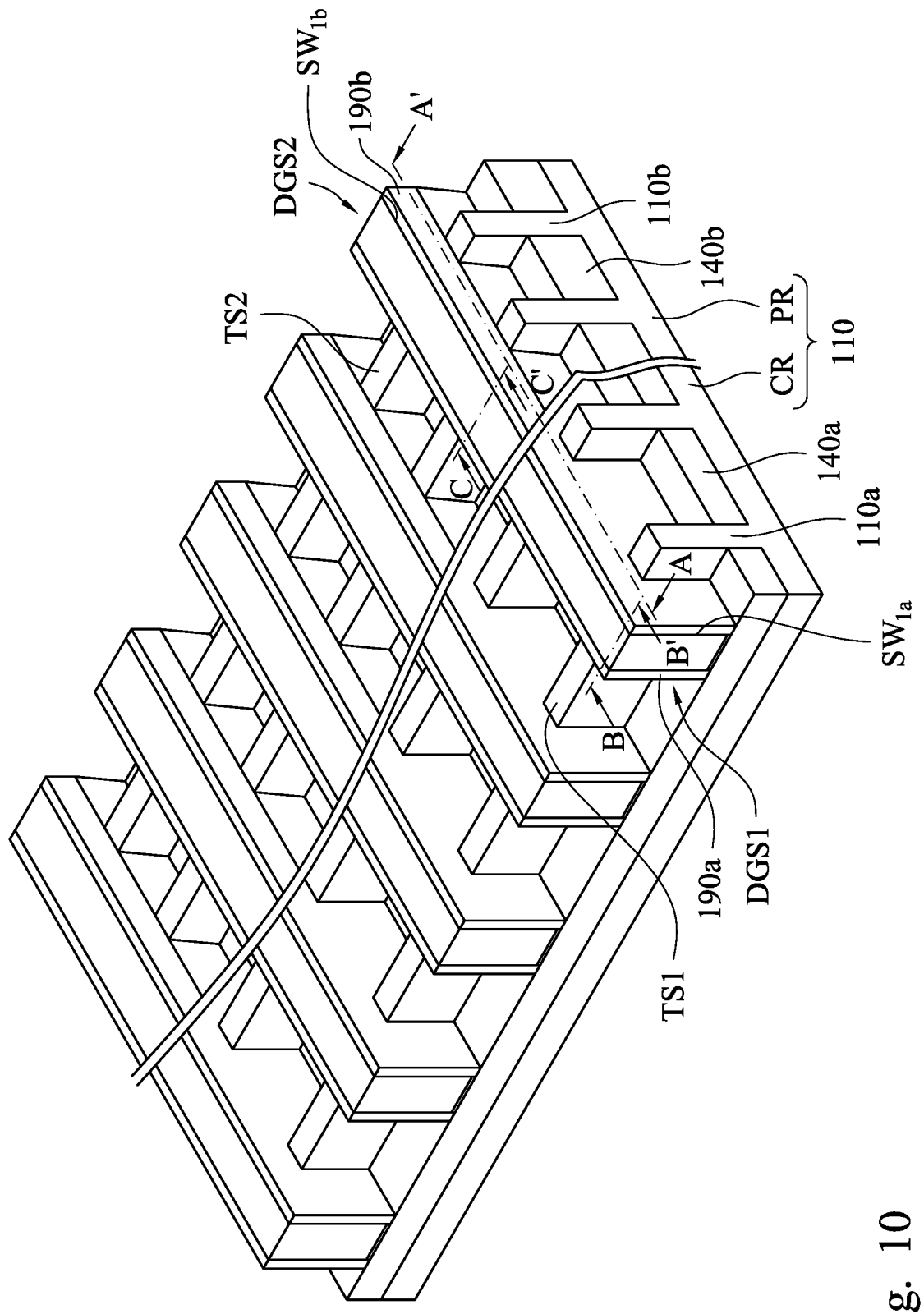
Figure 12:
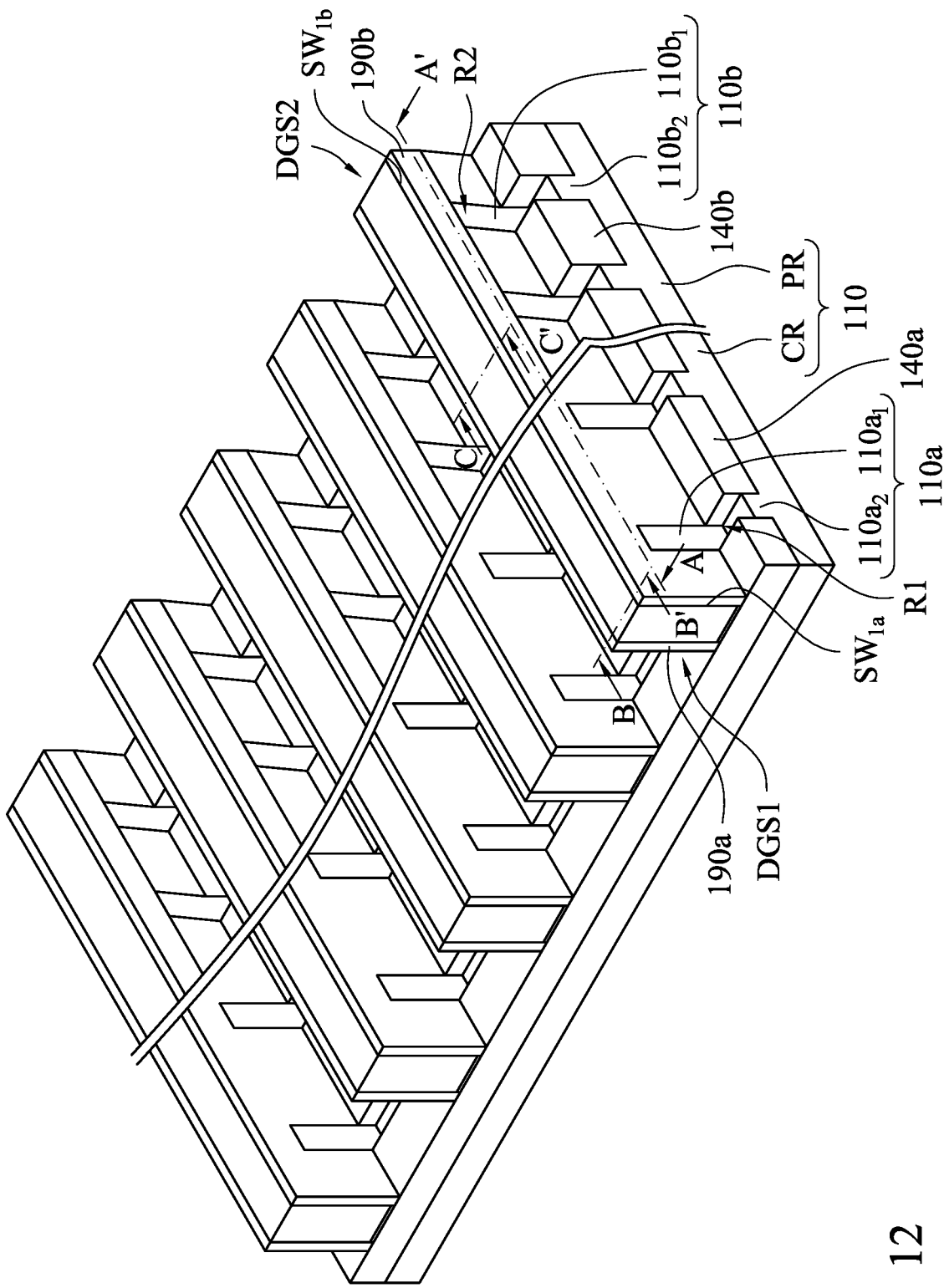
Figure 14:
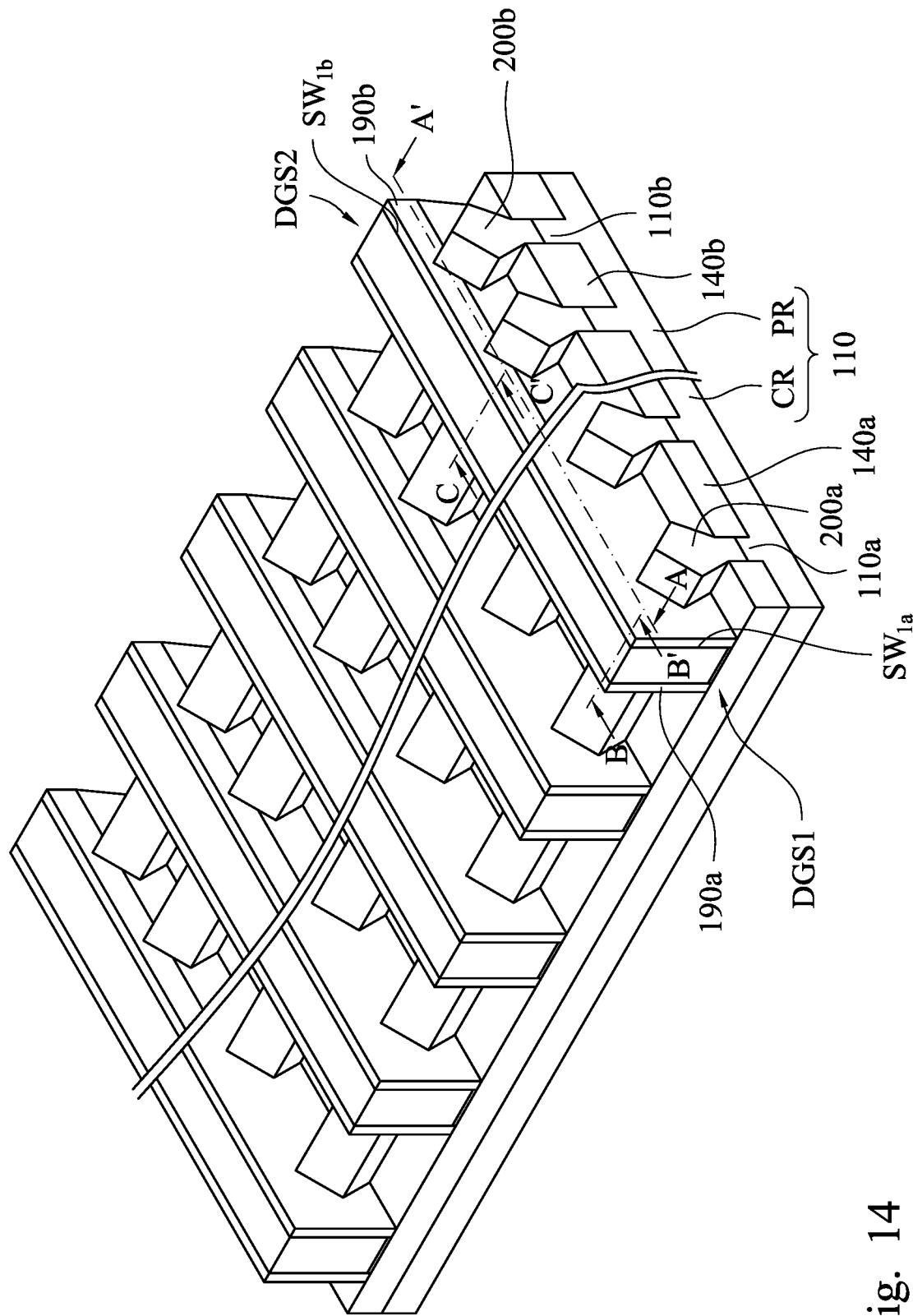
Figure 16:
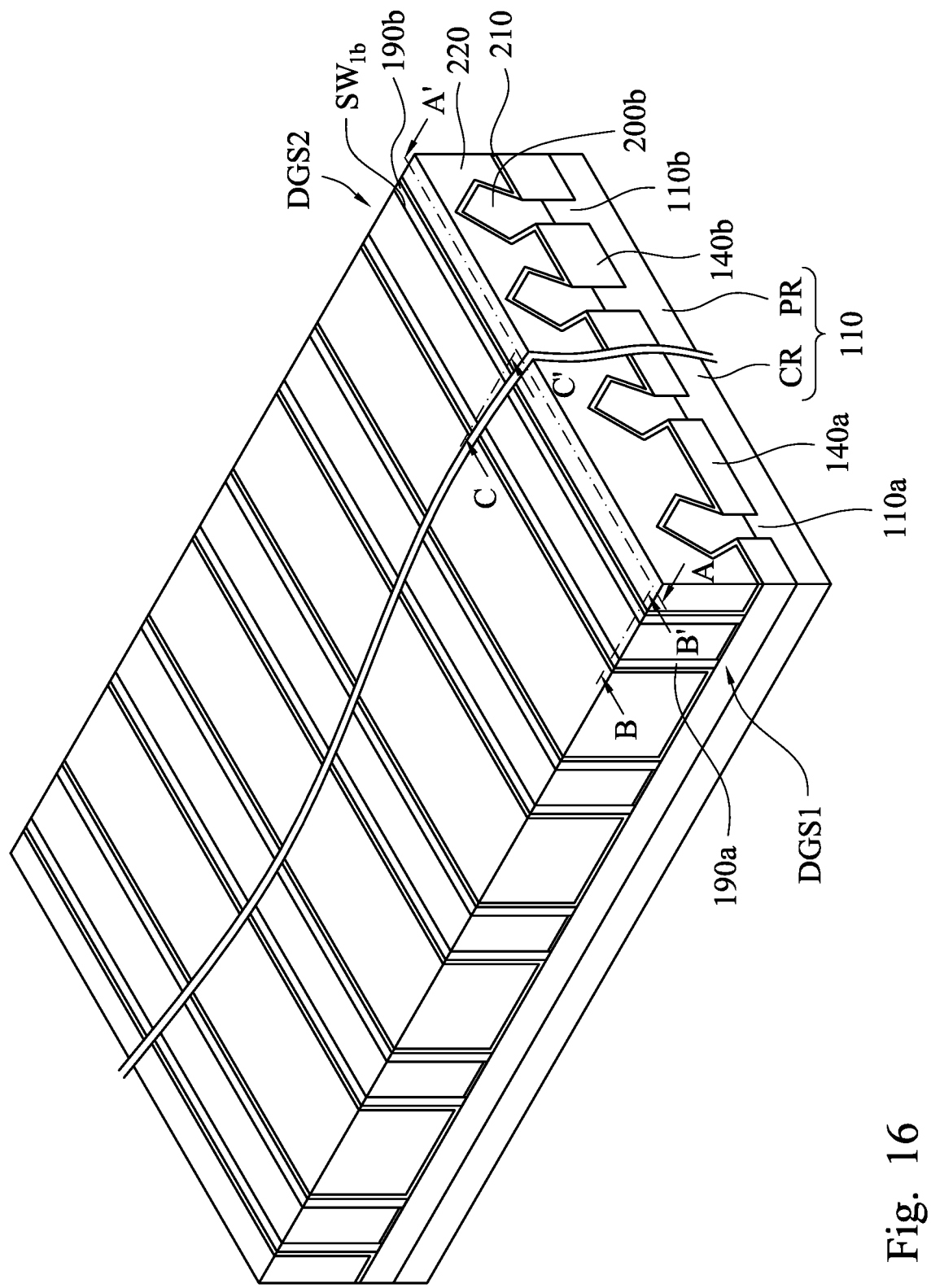

Please refer to FIGS. 7-8. The dummy gate electrode layers 160a, 160b, and the gate dielectric layers 150a, 150b, are etched to form a plurality of first dummy gate structures DGS1 and a plurality of second dummy gate structures DGS2. At least one of the first dummy gate structures DGS1 includes the gate dielectric layer 150a and the dummy gate electrode layer 160a, and crosses the first fins 110a. At least one of the second dummy gate structures DGS2 includes the gate dielectric layer 150b and the dummy gate electrode layer 160b, and crosses the second fins 110b.

As shown in FIG. 7, a plurality of first mask layers 170 are formed on the dummy gate electrode layer 160a, and a plurality of second mask layers 180 are formed on the dummy gate electrode layer 160b. In FIG. 7, a width $w_{31}$ of at least one of the first mask layers 170 is less than a width $w_{32}$ of at least one of the second mask layers 180. However, it is noted that the scope of this application is not limited thereto. In some other embodiments, a width $w_{31}$ of at least one of the first mask layers 170 is substantially equal to a width $w_{32}$ of at least one of the second mask layers 180. In still some embodiments, a width $w_{31}$ of at least one of the first mask layers 170 is greater than a width $w_{32}$ of at least one of the second mask layers 180. The first mask layers 170 and second mask layers 180 may be hard masks for protecting the underlying dummy gate electrode layer 160a, 160b, and the gate dielectric layer 150a, 150b, against subsequent etching process. The first mask layers 170 and second mask layers 180 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

As shown in FIG. 8, the dummy gate electrode layer 160a and the gate dielectric layer 150a is etched through the first mask layers 170 to form the first dummy gate structures DGS1 wrapping portions of the first fins 110a, and the dummy gate electrode layer 160b and the gate dielectric layer 150b is etched through the second mask layers 180 to form the second dummy gate structures DGS2 wrapping portions of the second fins 110b. At least one of the first dummy gate structures DGS1 includes a portion of the dummy gate electrode layer 160a and a portion of the gate dielectric layer 150a covered and protected by the first mask layer 170. At least one of the second dummy gate structures DGS2 includes a portion of the dummy gate electrode layer 160b and a portion of the gate dielectric layer 150b covered and protected by the second mask layer 180. The first dummy gate structures DGS1 and the second dummy gate structures DGS2 have substantially parallel longitudinal axes that are substantially perpendicular to longitudinal axes of the first fins 110a and the second fins 110b. After forming the first dummy gate structures DGS1 and the second dummy gate structures DGS2, the first mask layers 170 and the second mask layers 180 of FIG. 7 are removed. The first dummy gate structures DGS1 and the second dummy gate structures DGS2 will be replaced with replacement gate structures using a "gate-last" or replacement-gate process. Accordingly, the shape of the replacement gate structures can be determined by the shape of these dummy gate structures.

Further, because the width $w_{31}$ of at least one of the first mask layers 170 is less than the width $w_{32}$ of at least one of the second mask layers 180, a width (i.e., gate length) $w_{41}$ of at least one of the first dummy gate structures DGS1 is less than a width (i.e., gate length) $w_{42}$ of at least one of the second dummy gate structures DGS2. However, it is noted that the scope of this application is not limited thereto. The width $w_{41}$ and the width $w_{42}$ can be determined by the first mask layer 170 and the second mask layer 180 respectively. In some other embodiments, the width $w_{41}$ of at least one of the first dummy gate structures DGS1 is equal to the width $w_{42}$ of at least one of the second dummy gate structures DGS2. In still some embodiments, the width $w_{41}$ of at least one of the first dummy gate structures DGS1 is greater than the width $w_{42}$ of at least one of the second dummy gate structures DGS2.

Turning now to FIGS. 9A, 9B, and 9C to further clarify the instant disclosure, FIGS. 9A, 9B, and 9C are cross-sectional views along the lines A-A', B-B', and C-C' in FIG. 8 respectively. As shown in FIGS. 9A-9C, the first height $h_1$ from the top of the first fin 110a to the top of the first isolation dielectric 140a is greater than the second height $h_2$ from the top of the second fin 110b to the top of the second isolation dielectric 140b. Moreover, the first isolation dielectric 140a on the core region CR of the substrate 110 is thinner than the second isolation dielectric 140b on the periphery region PR of the substrate 110.

Please refer to FIGS. 7 and 8 again. The dummy gate electrode layer 160a and the gate dielectric layer 150a are etched through the first mask layers 170 and the second mask layers 180 to form the first dummy gate structures DGS1 and the second dummy gate structures DGS2 until both the first isolation dielectric 140a and the second isolation dielectric 140b expose. It is noted that, because the first isolation dielectric 140a is thinner than the second isolation dielectric 140b, the second isolation dielectric 140b is exposed earlier than the first isolation dielectric 140a. When etching the dummy gate electrode layer 160a and the gate dielectric layer 150a to form the lower portions of the first dummy gate structures DGS1, lower portions of the second dummy gate structures DGS2 is continuously etched (or trimmed). Accordingly, the resulting second dummy gate structures DGS2 have lower portions tapering toward the substrate 110. In other words, footings of second dummy gate structures DGS2 have notched profile.

When a dummy gate structure is formed to cross over fins, if a pitch between two adjacent fins is small, it is not easy to form the dummy gate structure with predetermined shape, especially the footing of the dummy gate structure. One skilled in the art should understand that the footing profile of the dummy gate structure will influence the subsequent process of forming a replacement gate structure, and thus is a factor for breakdown voltage (VBD) performance. It is noted that, the footings of second dummy gate structures DGS2 of the instant disclosure have notched profile; therefore, the second dummy gate structures DGS2 of the instant disclosure have upper portions wider than lower portions. Therefore, after the second dummy gate structures DGS2 is removed to form gate trenches, the gate trenches have a good filling performance with replacement gate structures, reducing the possibility of breakdown between gate and source/drain.

Please refer to FIGS. 9B-9C. In FIG. 9B, it can be seen that the first dummy gate structure DGS1 has two sidewalls $SW_{1a}$ substantially parallel to each other. However, in FIG. 9C, only a portion of the second dummy gate structure DGS2 has parallel sidewalls. More specifically, the second dummy gate structure DGS2 includes an upper portion DU having two first sidewalls $SWU_{1b}$ substantially parallel to each other and a lower portion DL tapers toward the substrate 110. Moreover, a top width $w_{S1}$ of the lower portion DL is greater than a bottom width $w_{S2}$ of the lower portion DL. Based on the above, it can be seen that, because the thickness of the first isolation dielectric 140a is less than the thickness of the second isolation dielectric 140b, the first height $h_1$ from the top of the first fin 110a to the top of the first isolation dielectric 140a is greater than the second height $h_2$ from the top of the second fin 110b to the top of the second isolation dielectric 140b. Accordingly, dummy gate structures with different shapes can be formed concurrently in the core region CR and the periphery region PR respectively.

Still referring to FIG. 9C, the lower portion DL has second sidewalls $SWL_{1b}$, and the second sidewalls $SWL_{1b}$ are substantially straight. However, it is noted that the scope of this application is not limited thereto. In some other embodiments, the second sidewalls $SWL_{1b}$ are concave. In FIG. 9C, the lower portion DL is below the top surface TS2 of the second fin 110b. The lower portion DL has a top surface substantially leveling with the top surface TS2 of the second fins 110b. However, it is noted that the scope of this application is not limited thereto. In some other embodiments, the lower portion DL has a top surface above the top surface TS2 of the second fin 110b. In still some other embodiments, the lower portion DL has a top surface below the top surface TS2 of the second fin 110b.

Attention is now invited to FIGS. 10 and 11A-11C. FIGS. 11A, 11B, and 11C are cross-sectional views along the lines A-A', B-B', and C-C' in FIG. 10 respectively. First gate spacers 190a are conformally formed on the opposite sidewalls $SW_{1a}$ of first dummy gate structures DGS1, and second gate spacers 190b are conformally formed on the opposite sidewalls $SW_{1b}$ of second dummy gate structures DGS2. As shown in FIG. 11B, a pair of first gate spacers 190a conformally covers sidewalls $SW_{1a}$ of the first dummy gate structure DGS1. As shown FIG. 11C, a pair of second gate spacers 190b conformally covers the first sidewalls $SWU_{1b}$ of the upper portion DU of the second dummy gate structure DGS2 and second sidewalls $SWL_{1b}$ of the lower portion DL of the second dummy gate structure DGS2. At least one of the second gate spacers 190b has a slanted portion SP in contact with one of the second sidewalls $SWL_{1b}$ of the lower portion DL of the second dummy gate structure DGS2.

In some embodiments, the first gate spacers 190a and the second gate spacers 190b may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The first gate spacers 190a and the second gate spacers 190b may include a single layer or multilayer structure made of different dielectric materials. The method of forming the first gate spacers 190a and the second gate spacers 190b includes blanket forming a dielectric layer on the structure shown in FIG. 8 using, for example, CVD, PVD or ALD, and then performing an etching process such as anisotropic etching to remove horizontal portions of the dielectric layer. The remaining portions of the dielectric layer on the sidewalls $SW_{1a}$ of the first dummy gate structures DGS1 can serve as the first gate spacers 190a, and the remaining portions of the dielectric layer on the sidewalls $SW_{1b}$ of the second dummy gate structures DGS2 can serve as the second gate spacers 190b. In some embodiments, the first gate spacers 190a and the second gate spacers 190b may be used to offset subsequently formed doped regions, such as source/drain regions. The first gate spacers 190a and the second gate spacers 190b may further be used for designing or modifying the source/drain region profile.

Reference is made to FIGS. 12 and 13A-13C. FIGS. 13A, 13B, and 13C are cross-sectional views along the lines A-A', B-B', and C-C' in FIG. 12 respectively. Portions of the first fins 110a not covered by the first dummy gate structures DGS1 and first gate spacers 190a, and portions of the second fins 110b not covered by the second dummy gate structures DGS2 and the second gate spacers 190b are respectively partially removed (or partially recessed) to form first recesses R1 and second recesses R2. After this removal, at least one of remaining first fins 110a may have protruding portions $110a_1$ and embedded portions $110a_2$, and at least one of remaining second fins 110b may have protruding portions $110b_1$ and embedded portions $110b_2$. The embedded portions $110a_2$ are embedded in the first isolation dielectric 140a, and exposed by the first recesses R1. The protruding portion $110a_1$ protrudes from the embedded portions $110a_2$ and is located between the first recesses R1. The embedded portions $110b_2$ are embedded in the second isolation dielectric 140b, and exposed by the second recesses R2. The protruding portion $110b_1$ protrudes from the embedded portions $110b_2$ and is located between the second recesses R2. The first dummy gate structures DGS1 wrap the protruding portions $110a_1$ and the second dummy gate structures DGS2 wrap the protruding portions $110b_1$, and hence the protruding portions $110a_1$ and the protruding portions $110b_1$ can act as channel regions of transistors. The embedded portions $110a_2$ spaced apart from the first dummy gate structures DGS1 and the embedded portions $110b_2$ spaced apart from the second dummy gate structures DGS2 can act as source/drain regions of transistors.

Formation of the first recesses R1 and the second recesses R2 may include a dry etching process, a wet etching process, or combination of dry and wet etching processes. This etching process may include reactive ion etch (RIE) using the first dummy gate structures DGS1, the first gate spacers 190a, the second dummy gate structures DGS2, and the second gate spacers 190b as masks, or by other suitable removal process.

Reference is made to FIGS. 14 and 15A-15C. FIGS. 15A, 15B, and 15C are cross-sectional views along the lines A-A', B-B', and C-C' in FIG. 14 respectively. First epitaxial source/drain structures 200a are respectively formed in the first recesses R1, and second epitaxial source/drain structures 200b are respectively formed in the second recesses R2. The first epitaxial source/drain structures 200a and the second epitaxial source/drain structures 200b may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions $110a_1$ of the first fins 110a and the embedded portions $110b_1$ of the second fins 110b respectively. As shown in FIGS. 15A and 15C, the second epitaxial source/drain structure 200b is over one of the second fins 110b, and has a footing portion FP in contact with the slanted portion SP of at least one of the second gate spacers 190b. In some embodiments, lattice constants of the first epitaxial source/drain structures 200a and the second epitaxial source/drain structures 200b are different from that of the first fins 110a and the second fins 110b, so that the channel region between the first epitaxial source/drain structures 200a can be strained or stressed by the first epitaxial source/drain structures 200a, the channel region between the second epitaxial source/drain structures 200b can be strained or stressed by the second epitaxial source/drain structures 200b to improve carrier mobility of the semiconductor structure and enhance the performance of the semiconductor structure.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 150 (e.g., silicon, silicon germanium, silicon phosphate, or the like). The first epitaxial source/drain structures 200a and the second epitaxial source/drain structures 200b may be in-situ doped. The doping species include P-type dopants, such as boron or $BF_2$; N-type dopants, such as phosphorus or arsenic; and/or other suitable dopants including combinations thereof. If the first epitaxial source/drain structures 200a and the second epitaxial source/drain structures 200b are not in-situ doped, a second implantation process (i.e., a junction implant process) is performed to dope the first epitaxial source/drain structures 200a and the second epitaxial source/drain structures 200b. One or more annealing processes may be performed to activate the first epitaxial source/drain structures 200a and the second epitaxial source/drain structures 200b. The annealing processes include rapid thermal annealing (RTA) and/or laser annealing processes.

Reference is made to FIGS. 16 and 17A-17C. FIGS. 17A, 17B, and 17C are cross-sectional views along the lines A-A', B-B', and C-C' in FIG. 16 respectively. A contact etch stop layer (CESL) 210 is blanket formed on the structure shown in FIG. 14, and an interlayer dielectric (ILD) layer 220 is formed on the CESL 210. A CMP process may be optionally performed to remove excessive material of the ILD layer 220 and the CESL 210 to expose the first dummy gate structures DGS1 and the second dummy gate structures DGS2. The CMP process may planarize a top surface of the ILD layer 220 with top surfaces of the first dummy gate structures DGS1, the first gate spacers 190a, the second dummy gate structures DGS2, and the second gate spacers 190b, and the CESL 210 in some embodiments. The CESL 210 includes silicon nitride, silicon oxynitride or other suitable materials. The CESL 210 can be formed using, for example, plasma enhanced CVD, low pressure CVD, ALD or other suitable techniques. The ILD layer 220 may include a material different from the CESL 210. In some embodiments, the ILD layer 220 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 220 may be formed using, for example, CVD, ALD, spin-on-glass (SOG) or other suitable techniques.

Figure 18:
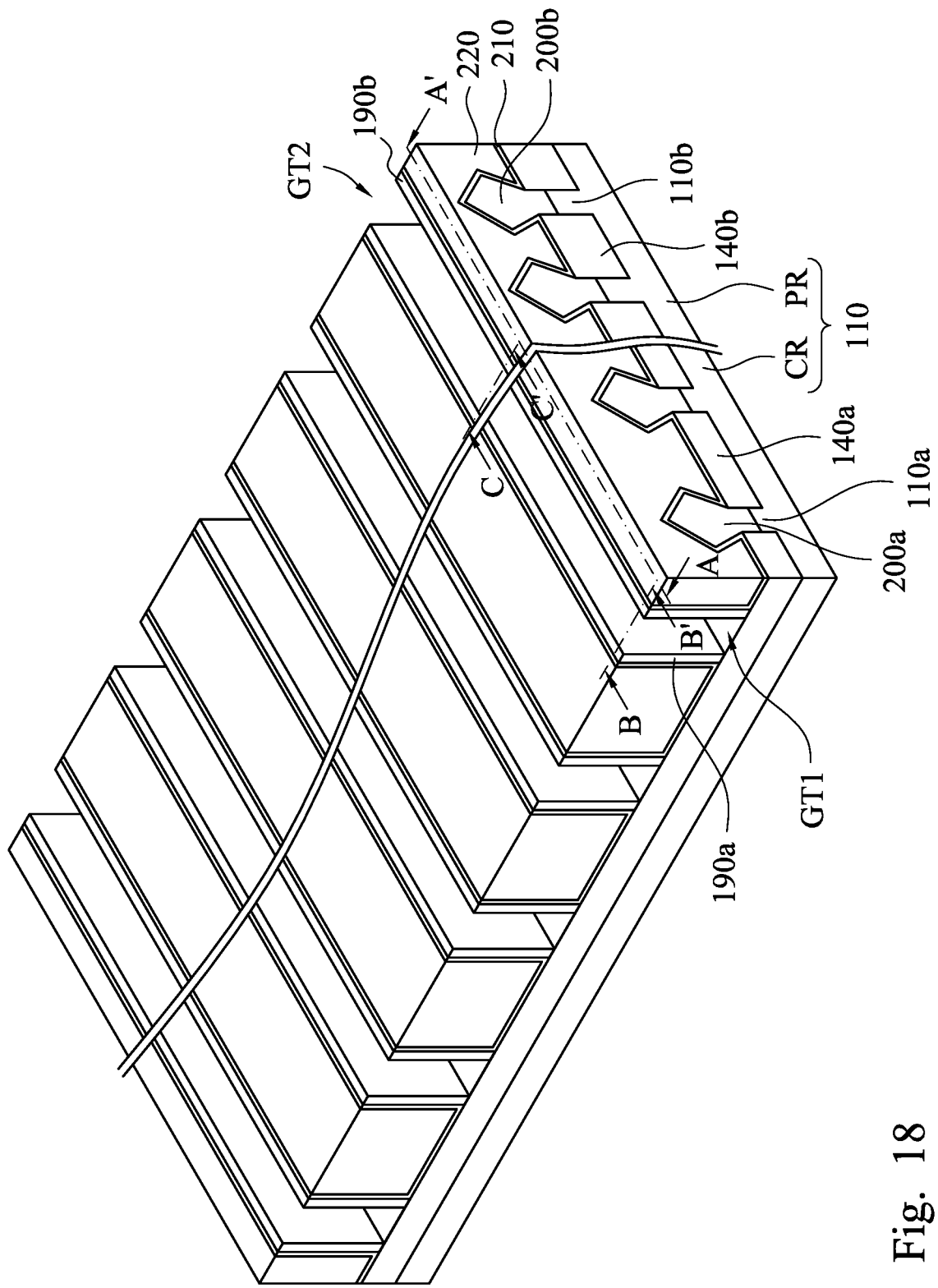
Figure 20:
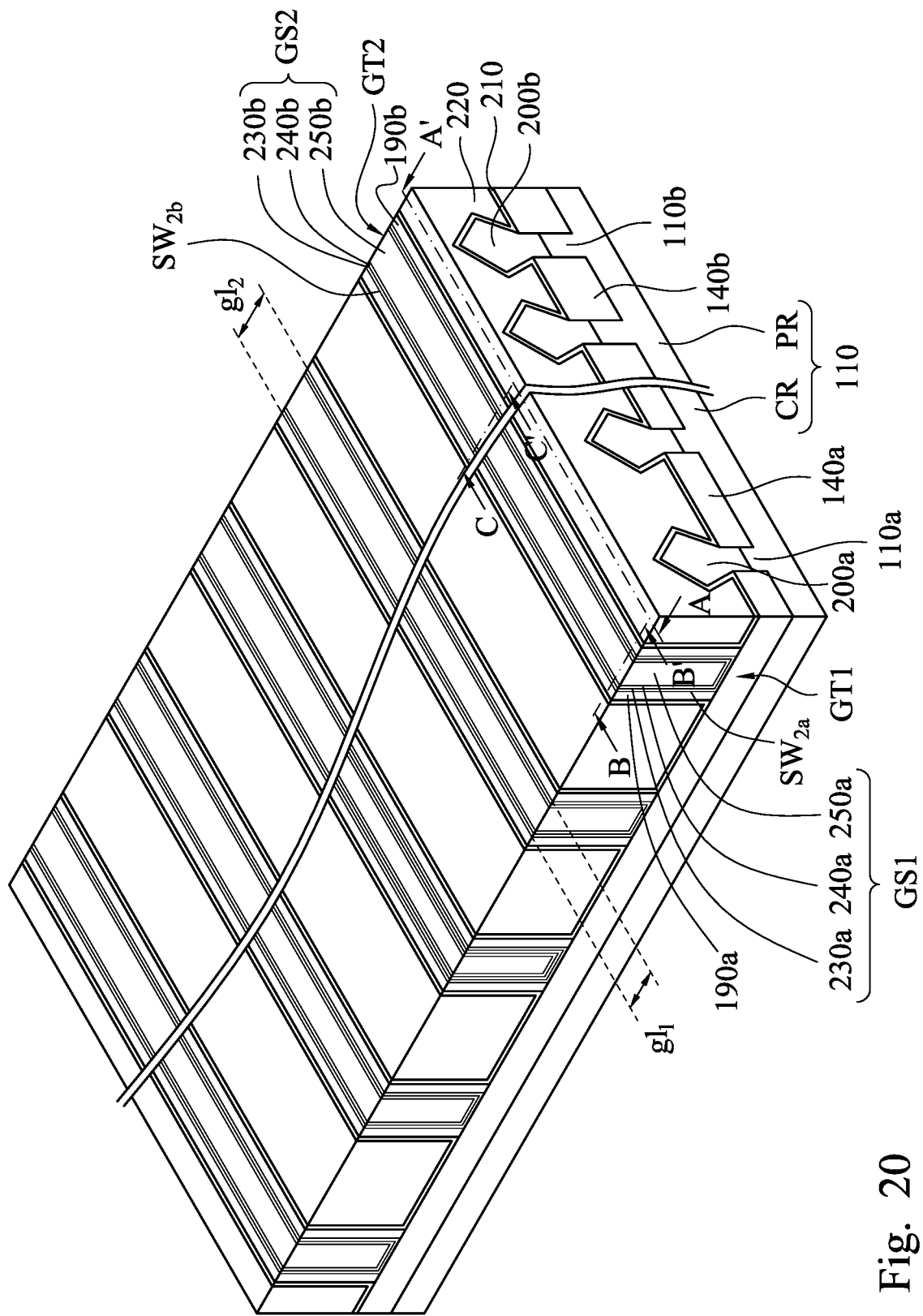

Please refer to FIGS. 18 and 20. The first dummy gate structures DGS1 are replaced with first gate structures GS1, and the second dummy gate structures DGS2 are replaced with second gate structures GS2. As such, as shown in FIG. 20, a semiconductor structure 100 is formed. The semiconductor structure 100 may be intermediate structures fabricated during processing of an integrated circuit, or portion thereof, that may include static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Attention is now invited to FIGS. 18 and 19A-19C. FIGS. 19A, 19B, and 19C are cross-sectional views along the lines A-A', B-B', and C-C' in FIG. 18 respectively. The first dummy gate structures DGS1 is removed to form gate trenches GT1 with the first gate spacers 190a as its sidewalls, and the second dummy gate structures DGS2 is removed to form gate trenches GT2 with the second gate spacers 190b as its sidewalls. As shown in FIG. 19B, the exposed sidewalls of the first gate spacers 190a are substantially straight. Therefore, the gate trench GT1 has substantially straight sidewalls. Further, a portion of the protruding portion $110a_1$ of the first fin 110a is exposed. As shown in FIG. 19C, the gate trench GT2 has an upper trench portion UP and a lower trench portion LP in communication with each other. The upper trench portion UP has substantially straight sidewalls, and the sidewalls substantially parallel to each other. The lower trench portion LP tapers toward the second isolation dielectric 140b (or the periphery region PR of the substrate 110). In FIG. 19C, the sidewalls of the lower trench portion LP are substantially straight. However, it is noted that the scope of this application is not limited thereto. In some other embodiments, the sidewalls of the lower trench portion LP are convex. Further, a portion of the protruding portion $110b_1$ of the second fin 110b is exposed. In FIG. 19C, the lower trench portion LP of the gate trench GT2 is below the top surface TS2 of the second fin 110b. The lower trench portion LP has a top substantially leveling with the top surface TS2 of the second fins 110b. However, it is noted that the scope of this application is not limited thereto. In some other embodiments, the lower trench portion LP has a top above the top surface TS2 of the second fin 110b. In still some other embodiments, the lower trench portion LP has a top below the top surface TS2 of the second fin 110b.

In some embodiments, the first dummy gate structures DGS1 and the second dummy gate structures DGS2 are removed by performing a first etching process and performing a second etching process after the first etching process. In some embodiments, the dummy gate electrode layers 160a, 160b are mainly removed by the first etching process, and the gate dielectric layers 150a, 150b are mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W.

Figure 21A:
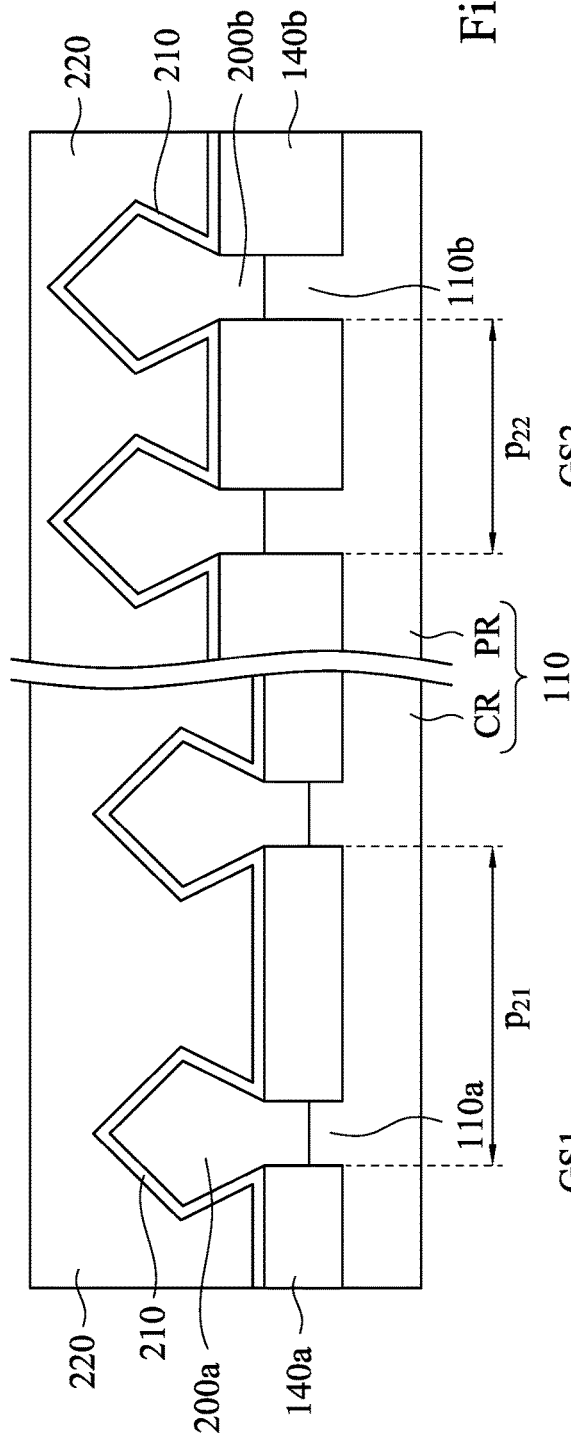
Figure 21C:
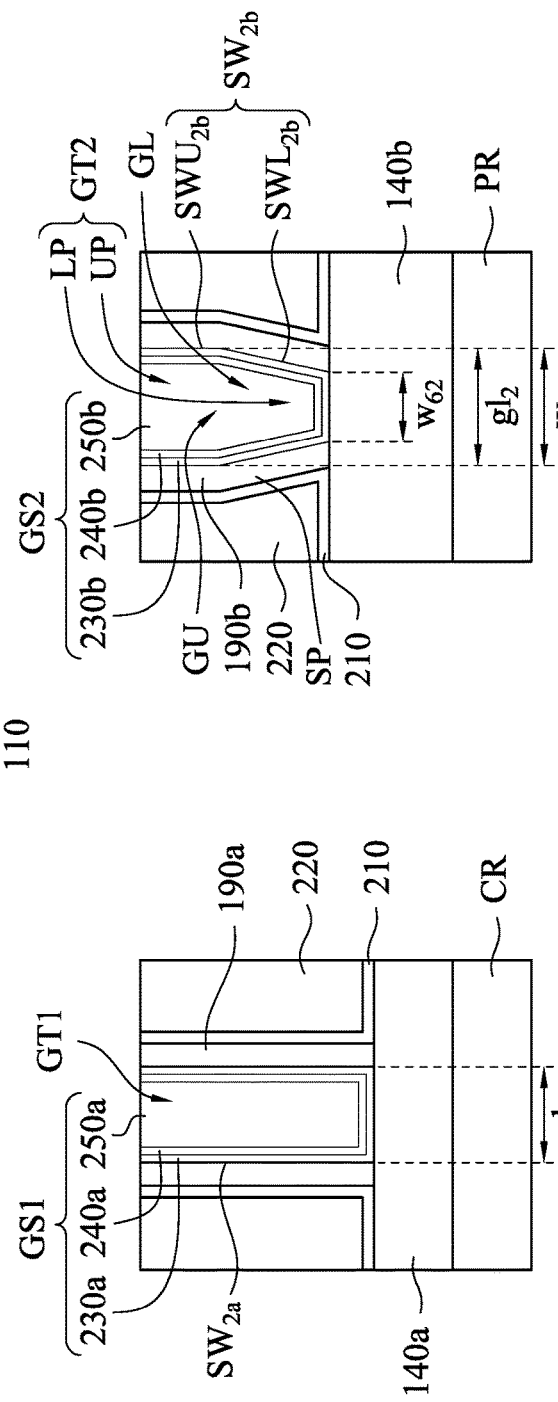
Figure 21B:
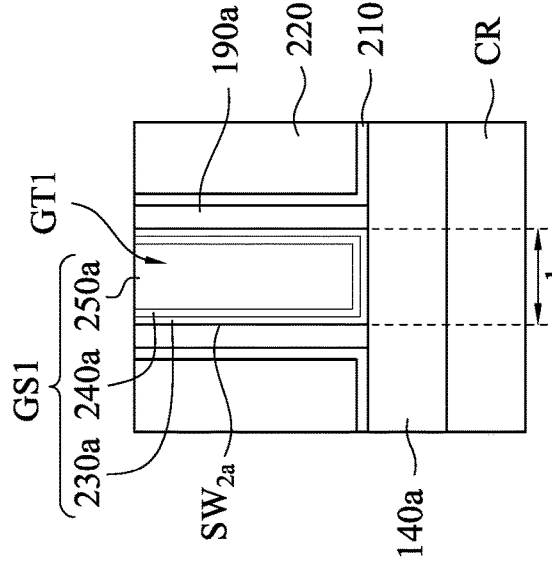

Attention is now invited to FIGS. 20 and 21A-21C. FIGS. 21A, 21B, and 21C are cross-sectional views along the lines A-A', B-B', and C-C' in FIG. 20 respectively. FIGS. 20 and 21A-21C illustrate formation of replacement gates. The first gate structures GS1 and the second gate structure GS2 are respectively formed in the gate trenches GT1 and GT2. Accordingly, the first gate structures GS1 crosses over the first fins 110a, and the second gate structures GS2 crosses over the second fins 110b. Exemplary method of forming these gate structures may include the following operations. A gate dielectric layer including a gate dielectric layer 230a and a gate dielectric layer 230b is blanket formed in the gate trenches GT1 and the gate trenches GT2, and over the first gate spacers 190a, the second gate spacers 190b, CESL 210, and ILD layer 220. A work function conductor including a work function conductor 240a and a work function conductor 240b is conformally formed over the gate dielectric layer. A layer of filling conductor including a filling conductor 250a and a filling conductor 250b is conformally formed over the work function conductor. A CMP process is performed to remove excessive materials of the gate dielectric layer 230a, 230b, the work function conductor 240a, 240b, and the filling conductor 250a, 250b outside the gate trenches GT1 and GT2. The resulting structure is shown in FIG. 20. In some embodiments, the work function conductor 240a is a multi-layer structure. In some embodiments, the work function conductor 240b is a multi-layer structure.

In some embodiments, the gate dielectric layer 230a, 230b may respectively include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 230a, 230b may respectively include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 230a, 230b may respectively have a multilayer structure such as one layer of silicon oxide (e.g., interfacial layer) and another layer of high-k material. The formation of the gate dielectric layer 230a, 230b may include molecular-beam deposition (MBD), atomic layer deposition (ALD), physical vapor deposition (PVD), chemical vapor deposition (CVD), or the like.

The work function conductors 240a, 240b over the gate dielectric layers 230a, 230b respectively include work function metals to provide a suitable work function for the gate structures GS1, GS2. In some embodiments, the work function conductors 240a, 240b may respectively include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductors 240a, 240b may respectively include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

The filling conductors 250a, 250b may exemplarily respectively include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Still referring to FIG. 20, at least one of the first gate structures GS1 has a first gate length $gl_1$. At least one of the second gate structures GS2 has a second gate length $gl_2$. The first gate length $gl_1$ is less than the second gate length $gl_2$. However, it is noted that the scope of this application is not limited thereto. In some other embodiments, the first gate length $gl_1$ is greater than the second gate length $gl_2$. In still some other embodiments, the first gate length $gl_1$ is substantially equal to the second gate length $gl_2$.

As shown in FIGS. 20 and 21A-21C, the semiconductor structure 100 includes a substrate 110, the first gate structures GS1, the second gate structures GS2, the first gate spacers 190a, the second gate spacers 190b, the contact etch stop layer 210, the interlayer dielectric layer 220, the first epitaxial source/drain structures 200a, and the second epitaxial source/drain structures 200b. The substrate 110 has the core region CR and the periphery region PR adjacent to the core region CR. The core region CR of substrate 110 has the first fins 110a. The periphery region PR has the second fins 110b. As shown in FIG. 21A, the first pitch $p_{21}$ between two adjacent first fins 110a is greater than the second pitch $p_{22}$ between two adjacent second fins 110b. Moreover, the first isolation dielectric 140a is between the first fins 110a. The second isolation dielectric 140b is between the second fins 110b. The first isolation dielectric 140a is thinner than the second isolation dielectric 140b.

As shown in FIG. 20, at least one of the first gate structures GS1 crosses over the first fins and includes the gate dielectric layer 230a, the work function conductor 240a, and the filling conductor 250a. As shown in FIG. 21B, the first gate structure GS1 has two sidewalls $SW_{2a}$ substantially parallel to each other. A pair of the first gate spacers 190a conformally covers the sidewalls $SW_{2a}$ of the first gate structure GS1. As shown in FIG. 20, each second gate structure GS2 crosses over the second fins 110b, and includes the gate dielectric layer 230b, the work function conductor 240b, and the filling conductor 250b. As shown in FIG. 21C, the second gate structure GS2 includes an upper portion GU and a lower portion GL, and has two sidewalls $SW_{2b}$. Each sidewall $SW_{2b}$ includes first sidewalls $SWU_{2b}$ and second sidewalls $SWL_{2b}$. The upper portion GU has two first sidewalls $SWU_{2b}$ substantially parallel to each other, and a lower portion GL tapers toward the periphery region PR of the substrate 110 (or the second isolation dielectric 140b). A top width $w_{61}$ of the lower portion GL is greater than a bottom width $w_{62}$ of the lower portion GL. In FIG. 21C, the lower portion GL has two second sidewalls $SWL_{2b}$, and the second sidewalls $SWL_{2b}$ are substantially straight. However, it is noted that the scope of this application is not limited thereto. In some other embodiments, the second sidewalls $SWL_{2b}$ are concave. A pair of the second gate spacers 190b conformally covers the first sidewalls $SWU_{2b}$ of the upper portion GU and the second sidewalls $SWL_{2b}$ of the lower portion GL. At least one of the second gate spacers 190b has the slanted portion SP in contact with one of the sidewalls $SWL_{2b}$ of the lower portion GL of the second gate structure GS2.

Still referring to FIG. 20, the pairs of the first gate spacers 190a cross over the first fins 110a. In each pair of the first gate spacers 190a, the gate trench GT1 is between two first gate spacers 190a. As shown in 21B, the gate trench GT1 has sidewalls substantially parallel to each other. The first gate structure GS1 is disposed in the gate trench GT1. More specifically, the gate dielectric layer 230a of the first gate structure GS1 is conformally disposed in the gate trench GT1 and covers the sidewalls and bottom surface of the gate trench GT1. The work function conductor 240a of the first gate structure GS1 is conformally disposed on the gate dielectric layer 230a. The filling conductor 250a of the first gate structure GS1 is conformally disposed on the work function conductor 240a.

Still referring to FIG. 20, the pairs of the second gate spacers 190b cross over the second fins 110b. In each pair of the second gate spacers 190b, the gate trench GT2 is between two second gate spacers 190b. As shown in 21C, the gate trench GT2 has the upper trench portion UP and the lower trench portion LP in communication with each other. The upper trench portion UP has substantially straight sidewalls, and the sidewalls substantially parallel to each other. The lower trench portion LP tapers toward the second isolation dielectric 140b (or the periphery region PR of the substrate 110). The second gate structure GS2 is disposed in the gate trench GT2. More specifically, the gate dielectric layer 230b of the second gate structure GS2 is conformally disposed in the gate trench GT2, and covers the sidewalls of the upper trench portion UP of the gate trench GT2 and the sidewalls and bottom surface of the lower trench portion LP of the gate trench GT2. The work function conductor 240b of the second gate structure GS2 is conformally disposed on the gate dielectric layer 230b. The filling conductor 250b of the second gate structure GS2 is conformally disposed on the work function conductor 240b.

Please refer to FIGS. 19C and 21C simultaneously. As previously described in FIG. 19C, the lower trench portion LP of the gate trench GT2 is below the top surface TS2 of the second fin 110b. The lower trench portion LP has the top substantially leveling with the top surface TS2 of the second fins 110b. Therefore, the lower portion GL of the second gate structure GS2 (i.e., the portion of the second gate structure GS2 filled in the lower trench portion LP) is below the top surface TS2 of the second fin 110b. The lower portion GL of the second gate structures GS2 has a top surface substantially leveling with the top surface TS2 of the second fin 110b. However, it is noted that the scope of this application is not limited thereto. In some other embodiments, the lower portion GL of the second gate structures GS2 has a top surface above the top surface TS2 of the second fin 110b. In still some other embodiments, the lower portion GL of the second gate structures GS2 has a top surface below the top surface TS2 of the second fin 110b.

Embodiments of the instant disclosure may have at least following advantages. The dummy gate structures on the periphery region of the substrate have upper portions wider than lower portions. Accordingly, when replacing the dummy gate structures with the gate structures, the shape of gate trenches formed after removing the dummy gate structures may be advantageous to fill the gate structures and enlarge breakdown voltage (VBD) between gate structures and source/drain.

In some embodiments of the present disclosure, a method includes forming a first fin on a semiconductor substrate; forming an isolation dielectric material over the first fin, planarizing the isolation dielectric material, wherein a top surface of the first fin is covered by the isolation dielectric material after planarizing the isolation dielectric material; and etching back the isolation dielectric material until the first fin protrudes from the isolation dielectric material.

In some embodiments of the present disclosure, a method includes forming a first fin and a second fin on a semiconductor substrate; forming a first STI region abutting the first fin and a second STI region abutting the second fin, wherein a top surface of the first STI region is lower than a top surface the second STI region; forming a gate electrode layer over the first fin and the second fin; performing an etching process on the gate electrode layer to form a first gate electrode over the first STI region and a second gate electrode over the second STI region, wherein the etching process is performed such that the second gate electrode has a tapered profile toward the second STI region and the first gate electrode is free from a tapered profile toward the first STI region.

In some embodiments of the present disclosure, a method includes forming a plurality of first fins in a first region of a substrate and a plurality of second fins in a second region of the substrate, the first fins having a greater pitch than the second fins; forming in sequence a gate dielectric layer and a gate electrode layer over the first fins and the second fins; and performing an etching process on the gate electrode layer to form a first gate electrode across the first fins and a second gate electrode across the second fins, wherein the etching process is performed such that a first sidewall of the first gate electrode between the first fins is non-parallel with a second sidewall of the second gate electrode between the second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of first fins on a semiconductor substrate;
    performing a deposition process to form an isolation dielectric material overfilling a trench between the first fins, resulting in the isolation dielectric material wrapping around a top surface and opposite sidewalls of each of the first fins;
    performing a chemical-mechanical planarization (CMP) process on the isolation dielectric material, wherein the top surface and the opposite sidewalls of each of the first fins remain wrapped around by the isolation dielectric material after the CMP process is complete; and
    etching back the isolation dielectric material until the first fins protrude from the isolation dielectric material.

2. The method of claim 1, wherein forming the first fins is performed such that a plurality of second fins is formed on the semiconductor substrate, and after etching back the isolation dielectric material, the first and second fins protrude from the isolation dielectric material by different distances.

3. The method of claim 2, wherein forming the first and second fins is performed such that the first fins have a different pitch than the second fins.

4. The method of claim 1, wherein forming the first fins is performed such that a plurality of second fins has less pitch than the first fins formed on the semiconductor substrate,
    wherein after etching back the isolation dielectric material, the first fins protrude from the isolation dielectric material by a first distance, and the second fins protrude from the isolation dielectric material by a second distance less than the first distance.

5. The method of claim 4, further comprising:
    forming a first gate structure across the first fins and a second gate structure across the second fins, wherein a width of the first gate structure is less than a width of the second gate structure.

6. The method of claim 5, wherein forming the first and second gate structures comprises:
    forming a gate electrode layer over the first fins and the second fins;
    forming first and second masks over the gate electrode layer, wherein the first mask extends across the first fins, the second mask extends across the second fins, and a width of the first mask is less than a width of the second mask; and
    etching the gate electrode layer using the first and second masks as an etching mask.

7. The method of claim 5, further comprising:
    forming a plurality of first gate spacers respectively on opposite sidewalls of the first gate structure and a plurality of second gate spacers respectively on opposite sidewalls of the second gate structure;
    removing the first and second gate structures to form a first gate trench between the first gate spacers and a second gate trench between the second gate spacers, wherein a width of the first gate trench is less than a width of the second gate trench; and
    forming a first metal gate structure in the first gate trench and a second metal gate structure in the second gate trench.

8. The method of claim 1, wherein before etching back the isolation dielectric material, the isolation dielectric material is in contact with the top surface and the opposite sidewalls of each of the first fins.

9. A method, comprising:
    forming a plurality of first fins and a plurality of second fins on a semiconductor substrate;
    forming a first shallow trench isolation (STI) region abutting the first fins and a second STI region abutting the second fins, wherein a top surface of the first STI region is lower than a top surface of the second STI region, wherein forming the first and second STI regions comprises depositing an isolation dielectric material overfilling a trench between the first fins and a trench between the second fins such that the isolation dielectric material wraps around a top surface and opposite sidewalls of each of the first and second fins, and performing a chemical-mechanical planarization (CMP) process on the isolation dielectric material, wherein the top surface and the opposite sidewalls of each of the first and second fins remain wrapped around by the isolation dielectric material after the CMP process is complete;
    forming a stack of a gate dielectric layer and a gate electrode layer over the first fins and the second fins; and
    performing an etching process on the stack of the gate dielectric layer and the gate electrode layer to form a first gate structure over the first STI region and a second gate structure over the second STI region, wherein the etching process simultaneously forms a tapered sidewall in the second gate structure toward and contacting the second STI region and no tapered sidewall in the first gate structure contacting the first STI region.

10. The method of claim 9, wherein the etching process is performed such that a width of the second gate structure is greater than a width of the first gate structure.

11. The method of claim 9, further comprising:
    forming a first gate spacer on a sidewall of the first gate structure and a second gate spacer on a sidewall of the second gate structure, wherein the first gate spacer is non-parallel with a lower portion of the second gate spacer.

12. The method of claim 11, wherein the second gate spacer is formed such that an upper portion of the second gate spacer is non-parallel with the lower portion of the second gate spacer.

13. The method of claim 9, further comprising:
    forming a plurality of first gate spacers respectively on opposite sidewalls of the first gate structure and a plurality of second gate spacers respectively on opposite sidewalls of the second gate structure;
    removing the first and second gate structures to form a first gate trench between the first gate spacers and a second gate trench between the second gate spacers, wherein the second gate trench has a tapered profile toward the second STI region and the first gate trench is free from a tapered profile toward the first STI region; and forming a first metal gate electrode in the first gate trench and a second metal gate electrode in the second gate trench.

14. The method of claim 9, wherein forming the first and second STI regions further comprises:

etching back the isolation dielectric material.

15. The method of claim 9, wherein a longitudinal axis of the first gate structure is aligned with a longitudinal axis of the second gate structure.

16. A method, comprising:

forming a plurality of first fins in a first region of a substrate and a plurality of second fins in a second region of the substrate, the first fins having a greater pitch than the second fins;

depositing an isolation dielectric material wrapping around a top surface and opposite sidewalls of each of the first and second fins;

performing a chemical-mechanical planarization (CMP) process on the isolation dielectric material;

stopping the CMP process performed on the isolation dielectric material, while leaving a portion of the isolation dielectric material wrapping around the top surface and the opposite sidewalls of each of the first and second fins;

etching back the portion of the isolation dielectric material to fall below the top surface of each of the first and second fins;

after etching back the portion of the isolation dielectric material, forming in sequence a gate dielectric layer and a gate electrode layer over the first fins and the second fins; and performing an etching process on the gate electrode layer to form a first gate electrode across the first fins and a second gate electrode across the second fins, wherein the etching process is performed such that a plurality of first sidewalls of the first gate electrode between the first fins are non-parallel with a plurality of second sidewalls of the second gate electrode between the second fins.

17. The method of claim 16, wherein the etching process is performed such that a distance between the second sidewalls of the second gate electrode is greater than a distance between the first sidewalls of the first gate electrode.

18. The method of claim 16, wherein the etching process is performed such that the second gate electrode has a plurality of third sidewalls respectively extending upwards from the second sidewalls of the second gate electrode and non-parallel with the second sidewalls.

19. The method of claim 18, wherein a distance between the third sidewalls of the second gate electrode is greater than a distance between the first sidewalls of the first gate electrode.

20. The method of claim 16, wherein the first and second gate electrodes share a common longitudinal axis, and the first sidewalls of the first gate electrode and the second sidewalls of the second gate electrode extend along the common longitudinal axis.

* * * * *